(12) United States Patent
Jung et al.

(10) Patent No.: US 12,540,402 B2
(45) Date of Patent: Feb. 3, 2026

(54) ELECTRONIC DEVICE INCLUDING OUTER HOUSING PLATED WITH CONDUCTIVE MEMBER AND MANUFACTURING METHOD THEREFOR

(71) Applicants: SAMSUNG ELECTRONICS CO., LTD., Suwon-si (KR); INTOPS. CO., LTD., Anyang-si (KR)

(72) Inventors: Chunghyo Jung, Suwon-si (KR); Wonjun Ko, Suwon-si (KR); Hyein Park, Suwon-si (KR); Yongsub Lee, Suwon-si (KR); Jaedeok Lim, Suwon-si (KR); Bumjin Cho, Suwon-si (KR); Chiyoung Yoon, Anyang-si (KR); Keunha Kim, Anyang-si (KR); Kyungha Koo, Suwon-si (KR); Hongki Moon, Suwon-si (KR)

(73) Assignees: SAMSUNG ELECTRONICS CO., LTD., Suwon-si (KR); INTOPS. CO., LTD, Anyang-si (KR)

( * ) Notice: Subject to any disclaimer, the term of this patent is extended or adjusted under 35 U.S.C. 154(b) by 374 days.

(21) Appl. No.: 18/137,062

(22) Filed: Apr. 20, 2023

(65) Prior Publication Data

US 2023/0257884 A1    Aug. 17, 2023

Related U.S. Application Data

(63) Continuation of application No. PCT/KR2021/014748, filed on Oct. 20, 2021.

(30) Foreign Application Priority Data

Oct. 20, 2020 (KR) .................. 10-2020-0136094
Feb. 24, 2021 (KR) .................. 10-2021-0024804

(51) Int. Cl.
*C23C 18/20* (2006.01)
*B23C 3/30* (2006.01)
(Continued)

(52) U.S. Cl.
CPC ............ *C23C 18/2013* (2013.01); *B23C 3/30* (2013.01); *C23C 18/1651* (2013.01);
(Continued)

(58) Field of Classification Search
CPC ............ C23C 18/2013; C23C 18/1651; C23C 18/1689; C23C 18/1603; B23C 3/30;
(Continued)

(56) References Cited

U.S. PATENT DOCUMENTS 6,015,520 A    1/2000   Appelt et al.
6,265,671 B1   7/2001   Matsuno
(Continued)

FOREIGN PATENT DOCUMENTS

CN    1172414 A      2/1998
CN    102610898 A    7/2012
(Continued)

OTHER PUBLICATIONS

Communication issued on Mar. 10, 2025 from the Intellectual Property Office of Vietnam for Vietnamese Patent Application No. 1-2023-02469.
(Continued)

*Primary Examiner* — Diane D Mizrahi
(74) *Attorney, Agent, or Firm* — Sughrue Mion, PLLC

(57) ABSTRACT

The present disclosure provides electronic device and methods of manufacturing the electronic devices. In some embodiments, the electronic device includes an outer housing at least partially forming an exterior of the electronic device, a trench including at least one valley and at least one peak, a first conductive member, and a coating layer lami-
(Continued)

nated on the outer housing and disposed on the first conductive member. Each of the at least one valley is concave with respect to a surface of the outer housing. Each of the at least one peak is convex with respect to the surface of the outer housing and has a partially removed end. The trench is plated with the first conductive member.

20 Claims, 24 Drawing Sheets

(51) Int. Cl.
    *B23K 26/364*      (2014.01)
    *C23C 18/16*      (2006.01)
    *H05K 5/02*      (2006.01)

(52) U.S. Cl.
    CPC ....... *C23C 18/1689* (2013.01); *H05K 5/0247* (2013.01); *B23K 26/364* (2015.10)

(58) Field of Classification Search
CPC .... H05K 5/0247; H05K 3/002; H05K 3/0032; H05K 3/282; H05K 3/28; H05K 3/42; H05K 2201/09036; H05K 2201/09827; H05K 2201/0999; H05K 2201/10098; H05K 2203/0228; H05K 2203/025; H05K 2203/0716; H05K 2203/107; H05K 2203/108; H05K 1/0237; H05K 3/18; H05K 3/185; H05K 3/26; H05K 3/381; B23K 26/364; G06F 1/1656; H01Q 1/243
See application file for complete search history.

(56) References Cited

U.S. PATENT DOCUMENTS

| | | | |
|---|---|---|---|
| 10,109,908 B2 | 10/2018 | Youm et al. | |
| 10,545,611 B2 | 1/2020 | Kwon et al. | |
| 11,405,540 B2 * | 8/2022 | Lee .......................... | H05K 3/34 |
| 2002/0005359 A1 | 1/2002 | Hongo et al. | |
| 2002/0184757 A1 | 12/2002 | Lee et al. | |
| 2011/0021255 A1 | 1/2011 | Kim et al. | |
| 2011/0317343 A1 | 12/2011 | Shin et al. | |
| 2013/0032485 A1 | 2/2013 | Muramatsu et al. | |
| 2013/0140074 A1 | 6/2013 | Yang et al. | |
| 2014/0106085 A1 | 4/2014 | Cho et al. | |
| 2015/0176819 A1 | 6/2015 | Kim et al. | |
| 2015/0245513 A1 | 8/2015 | Moon | |
| 2015/0288055 A1 | 10/2015 | Youm et al. | |
| 2015/0349406 A1 | 12/2015 | Jung et al. | |
| 2020/0028243 A1 | 1/2020 | Cho | |
| 2020/0264658 A1 | 8/2020 | Seo et al. | |

FOREIGN PATENT DOCUMENTS

| | | |
|---|---|---|
| CN | 103179809 A | 6/2013 |
| CN | 103730716 A | 4/2014 |
| JP | 2004-247549 A | 9/2004 |
| JP | 2009-159588 A | 7/2009 |
| JP | 5354950 B2 | 11/2013 |
| KR | 10-0425728 B1 | 4/2004 |
| KR | 10-0492465 B1 | 5/2005 |
| KR | 10-0494034 B1 | 6/2005 |
| KR | 10-0554855 B1 | 6/2006 |
| KR | 10-0955546 B1 | 4/2010 |
| KR | 10-2010-0092311 A | 8/2010 |
| KR | 10-2015-0072028 A | 6/2015 |
| KR | 10-1537739 B1 | 7/2015 |
| KR | 10-2015-0099329 A | 8/2015 |
| KR | 10-2015-0115586 A | 10/2015 |
| KR | 10-2016-0011768 A | 2/2016 |
| KR | 10-1736862 B1 | 5/2017 |
| KR | 10-2017-0073321 A | 6/2017 |
| KR | 10-1778553 B1 | 9/2017 |
| KR | 10-2017-0138197 A | 12/2017 |
| KR | 10-1868827 B1 | 6/2018 |
| KR | 10-2053862 B1 | 12/2019 |
| KR | 10-2055682 B1 | 12/2019 |
| KR | 10-2020-0099733 A | 8/2020 |
| KR | 10-2022-0084540 A | 6/2022 |
| WO | 2012/132325 A1 | 10/2012 |
| WO | 2022/131440 A1 | 6/2022 |
| WO | 2022/131638 A1 | 6/2022 |

OTHER PUBLICATIONS

International Preliminary Report on Patentability issued on Apr. 13, 2023 from the International Searching Authority in PCT/KR2021/014748.
Communication issued on Mar. 21, 2025 from the Korean Intellectual Property Office for Korean Patent Application No. 10-2021-0039524.
Communication issued on Apr. 17, 2025 from the China National Intellectual Property Administration for Chinese Patent Application No. 202180071667.9.
Communication dated Jan. 19, 2022, issued by the International Searching Authority in counterpart International Application No. PCT/KR2021/014748 (PCT/ISA/210).
Communication dated Jan. 19, 2022, issued by the International Searching Authority in counterpart International Application No. PCT/KR2021/014748 (PCT/ISA/237).
Communication dated Jun. 30, 2022, issued by the International Searching Authority in counterpart International Application No. PCT/KR2022/004051 (PCT/ISA/210).
Communication issued Feb. 22, 2024 by the European Patent Office in European Patent Application No. 21883254.1.
Office Action issued on Dec. 18, 2025 by the United States Patent Office in corresponding U.S. Appl. No. 18/473,559.
Communication issued Sep. 27, 2025 by the China National Intellectual Property Administration in Chinese Patent Application No. 202180071667.9.

* cited by examiner

ELECTRONIC DEVICE INCLUDING OUTER HOUSING PLATED WITH CONDUCTIVE MEMBER AND MANUFACTURING METHOD THEREFOR

CROSS-REFERENCE TO RELATED APPLICATIONS

This application is a continuation application of International Application No. PCT/KR2021/014748, filed on Oct. 20, 2021, which claims priority to Korean Patent Application No. 10-2020-0136094, filed on Oct. 20, 2020, and to Korean Patent Application No. 10-2021-0024804, filed on Feb. 24, 2021, in the Korean Intellectual Property Office, the disclosures of which are incorporated by reference herein in their entireties.

BACKGROUND

1. Field

The present disclosure relates generally to electronic devices, and more particularly, to an electronic device including an outer housing on which a conductive member is arranged by plating, and a method of manufacturing the electronic device.

2. Description of Related Art

A conductive member may be disposed on a housing of electronic devices manufactured according to various methods. The conductive member may be used as an antenna pattern and/or a wire for electrical connection between electronic components of the electronic devices. For example, the manufacturing methods may include utilizing a flexible printed circuit board (FPCB) that may be attachable to a housing and/or a method of disposing the conductive member on a housing by plating. Related techniques of forming an antenna pattern by plating may include using a laser, such as, but not limited to, laser direct structuring (LDS) and laser manufacturing antenna (LMA).

LDS may refer to a plating method using a polymer resin. For example, an antenna pattern may be formed by degrading a metal-organic compound with a laser due to photochemical reactions caused by using the laser, such that only the metal portion of a part irradiated with the laser remains. However, the LDS method may require a housing molding stage with a heavy metal acting as a catalyst in the plating.

In LMA, unlike LDS, a heavy metal may not need to be added in a housing molding stage. For example, in LMA, the housing may be irradiated with a laser, and the irradiated part may be treated with a catalyst to plate the antenna pattern on the housing.

Furthermore, FPCBs may contain defects that may occur according to the skill of an assembler, which may cause a severe deviation in the performance of the antenna pattern. In addition, material options for housings that may be used with an LDS process may be limited, and such housings have a low strength. Further, an electronic device housing manufactured using the LMA method may be vulnerable to high temperature, high humidity, and delamination.

Accordingly, at least the inner surface of housings may be subject to the constraints described above. In addition, when a conductive member is disposed on the outer surface of a housing, the conductive member may be seen from the outside due to the step between a part in which the conductive member is disposed in a process of plating with the conductive member, and a part in which the conductive member is not disposed.

SUMMARY

Various aspects of the present disclosure may provide an electronic device including an outer housing plated with a conductive member and a method of manufacturing same, wherein the conductive member is prevented from being seen from the outside while the conductive member is stably disposed on the outer surface of a housing configuring the exterior of the electronic device.

According to an aspect of the present disclosure, an electronic device is provided. The electronic device includes an outer housing at least partially forming an exterior of the electronic device, a trench including at least one valley and at least one peak, a first conductive member, and a coating layer laminated on the outer housing and disposed on the first conductive member. Each of the at least one valley is concave with respect to a surface of the outer housing. Each of the at least one peak is convex with respect to the surface of the outer housing and has a partially removed end. The trench is plated with the first conductive member.

According to an aspect of the present disclosure, a method of manufacturing an electronic device is provided. The method includes forming a first trench in a first plating area of a first surface of an outer housing at least partially forming an exterior of the electronic device. The first surface is exposed to the outside. The method further includes forming, in a plating area, a first plating layer comprising a first metallic material. The plating area includes at least one of the first plating area, a second plating area, and a third plating area. The method further includes polishing the first plating area. The method further includes forming a coating layer on the first surface of the outer housing.

According to an aspect of the present disclosure, a case of an electronic device is provided. The case of the electronic device includes an outer housing, a trench including a valley and a peak, a first conductive member, and a coating layer laminated on the outer housing and disposed on the first conductive member. The valley of the trench is concave with respect to a surface of the outer housing. The peak of the trench is convex with respect to the surface of the outer housing and has a partially removed end. The trench is plated with the first conductive member.

According to various aspects of the present disclosure, even when a conductive member is disposed on the outer surface of a housing, the conductive member may be prevented from being seen from the outside.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
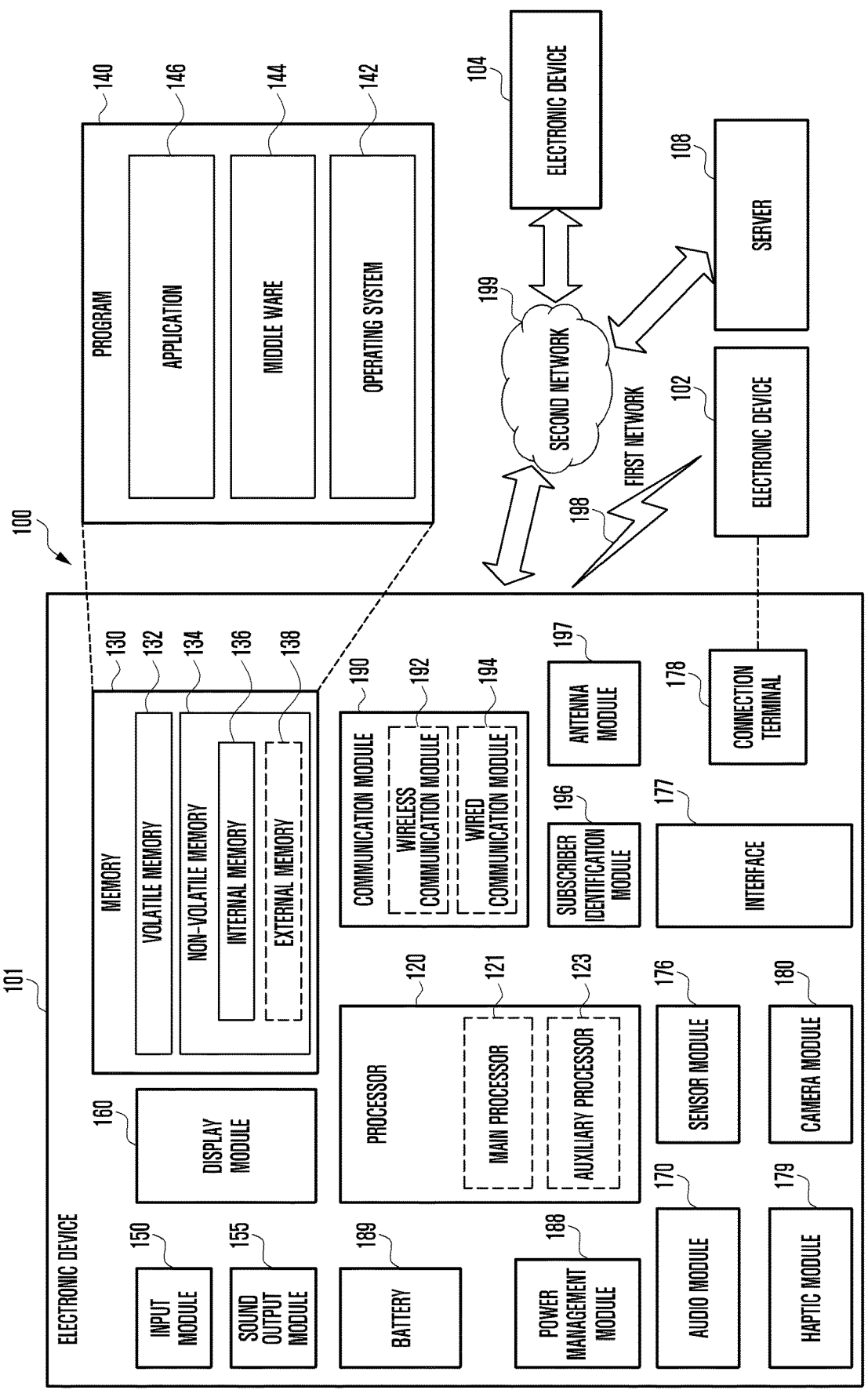
FIG. 1 is a block diagram of an electronic device in a network environment, according to various embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
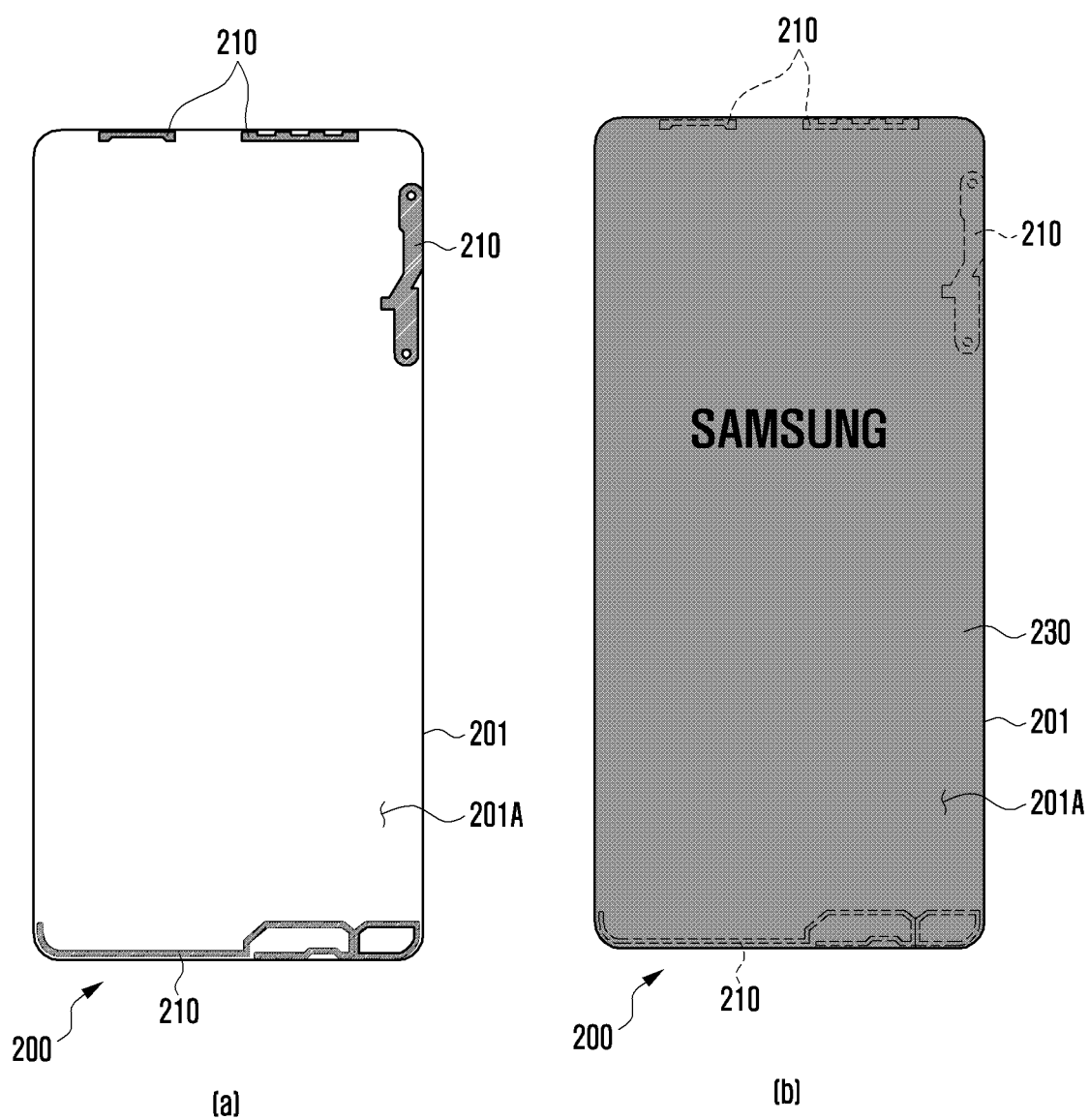
FIGS. 2 to 4 illustrate an electronic device including an outer housing including a conductive member, according to various embodiments.
Figure 3:
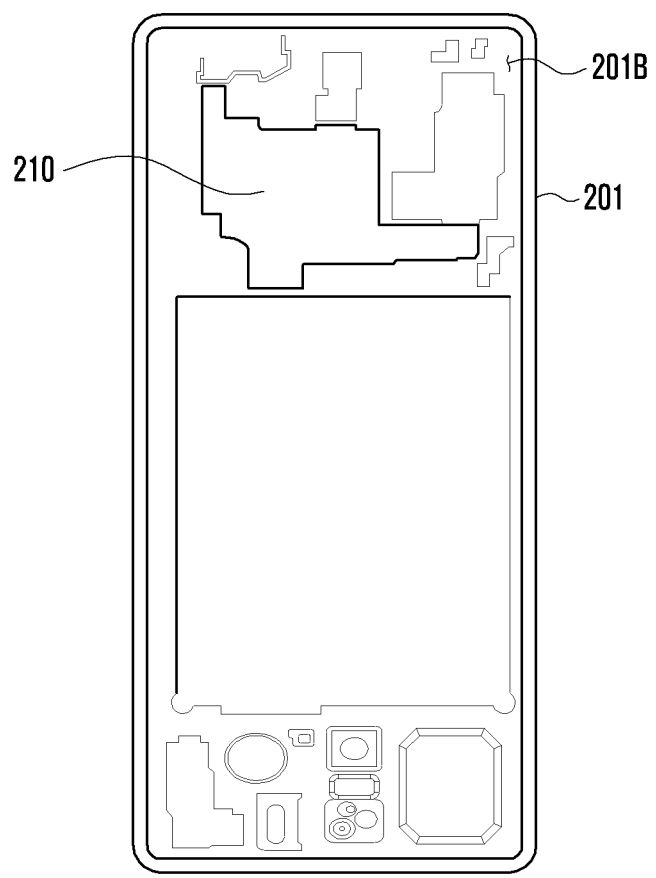
Figure 4:
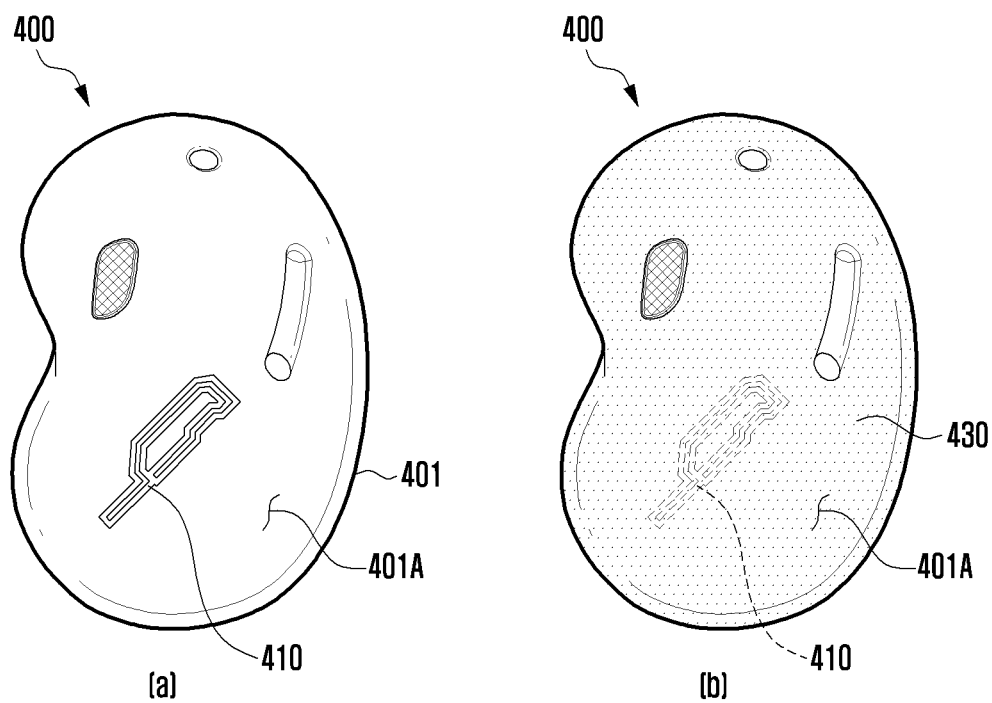

FIGS. 2 to 4 illustrate various embodiments of an electronic device including an outer housing including a conductive member, according to various embodiments. Diagram (a) of FIG. 2 and diagram (a) of FIG. 4 show a conductive member that is visible before a coating layer is formed.

According to various embodiments, an electronic device may include an outer housing 201 forming an exterior of the electronic device. The outer housing 201 may be include one or more materials and/or combinations of materials. For example, the outer housing 201 may include materials, such as, but not limited to, a metal and/or a synthetic resin. Alternatively or additionally, the outer housing 201 may be manufactured using at least one of various methods. For example, the outer housing 201 may be manufactured using an injection method.

Referring to FIG. 2, a conductive member 210 may be disposed in a plating area corresponding to at least a partial area of a first surface 201A of the outer housing 201. The first surface 201A may be a surface of the outer housing 201, which may be exposed to the outside. In an embodiment, the conductive member 210 may be disposed on the first surface 201A of the outer housing 201 by plating. For example, the conductive member 210 may include a first plating layer (e.g., a first plating layer 620 in FIG. 6D) formed in a first plating operation (e.g., a first plating operation 503 in FIG. 5) and/or a second plating layer (e.g., a second plating layer 630 in FIG. 6E) formed in a second plating operation (e.g., a second plating operation 505 in FIG. 5) described below with reference to FIGS. 5, 6D, and 6E.

Referring to diagram (b) of FIG. 2, a coating layer 230 may be disposed on the first surface 201A of the outer housing 201. The coating layer 230 may be disposed on the first surface 201A of the outer housing 201 including a plating area on which the conductive member 210 is disposed. Consequently, the conductive member 210 may not be exposed to the outside of an electronic device 200. The conductive member 210 may be not be seen from the outside, and thus a degradation to the aesthetic appearance of the electronic device 200 due to the external visibility of the conductive member 210 may be prevented.

According to various embodiments, the conductive member 210 may be used as an element of the electronic device 200 requiring transfer of an electrical signal. For example, the conductive member 210 may be used as an antenna for short-range and/or long-range communication of the electronic device 200. Alternatively or additionally, the conductive member 210 may be used as a wire electrically connecting (e.g., coupling) various electronic components. For example, the conductive member 210 may be used as a touch sensor for recognition of a capacitive touch input, and the like. However, the present disclosure is not limited in this regard. For example, the conductive member 210 may be used as various elements requiring transfer of an electrical signal.

According to various embodiments, the coating layer 230 disposed on the first surface 201A of the outer housing 201 may include one or more materials having various properties according to a usage and/or functionality of the conductive member 210. For example, in a case where the conductive member 210 is used as an antenna and/or a wire electrically connecting electronic components, the coating layer 230 may include an insulation material having a low conductivity, for example. Alternatively or additionally, in a case where the conductive member 210 is used to recognize an electrical signal from the outside, the coating layer 230 may include a material having a high conductivity. For example, in a case where the conductive member 210 is used as a touch sensor recognizing a capacitive touch input, the coating layer 230 may include a material having a high conductivity.

According to various embodiments, a plating area in which the conductive member 210 is disposed may be thicker than other areas of the outer housing 201. When the plating area is thicker than remaining areas of the outer housing 201, the plating area may have a relatively high tolerance to external impact, when compared to the remaining areas of the outer housing 201. Therefore, damage to the conductive member 210 due to external impact may be prevented. Consequently, the plating area may enable the conductive member 210 disposed in the plating area to maintain a designated performance.

According to an embodiment, as shown in FIG. 3, the conductive member 210 may be disposed on a second surface 201B of the outer housing 201. The second surface 201B may be a surface opposite to the first surface 201A. Alternatively or additionally, the second surface 201B may be a surface facing at least a portion of the electronic components arranged in the electronic device 200. For example, a plate area in which the conductive member 210 is disposed may indicate at least a partial area of the second surface 201B of the outer housing 201. The second surface 201B of the outer housing 201 may be a surface facing an electronic component disposed in the electronic device 200. The conductive member 210 disposed on the second surface 201B may be used as a wire electrically connected to an electronic component and/or may be used as a heat dissipation member disposed in an area facing a heat radiating component (e.g., a processor (e.g., the processor 120 in FIG. 1), a power management module (e.g., the power management module 188 in FIG. 1), and a battery (e.g., the battery 189 in FIG. 1)). In a case where the conductive member 210 is used as a heat dissipation member, a plating area in which the conductive member 210 is disposed may be an area facing a heat radiating component. However, the present disclosure is not limited in this regard. For example, the conductive member 210 may be used as various elements that may include elements requiring transfer of an electrical signal and/or transfer of heat.

Referring to FIG. 4, an electronic device 400 may be worn in a user's ear and may be connected to an external electronic device via short-range communication to reproduce sound. A conductive member 410 may be disposed in a partial area of a first surface 401A of an outer housing 401 forming an exterior of the electronic device 400. The first surface 401A may indicate a surface of the outer housing 401, which may be exposed to the outside. The conductive member 410 may be used as an antenna for connecting an external electronic device to the electronic device 400. Alternatively or additionally, the conductive member 410 may be used as a touch sensor for receiving a user's touch input. As shown in diagram (b) of FIG. 4, a coating layer 430 may be disposed on the first surface 401A of the outer housing 401. The conductive member 410 may be covered by the coating layer 430, and thus may not be visible from the outside.

Figure 5:
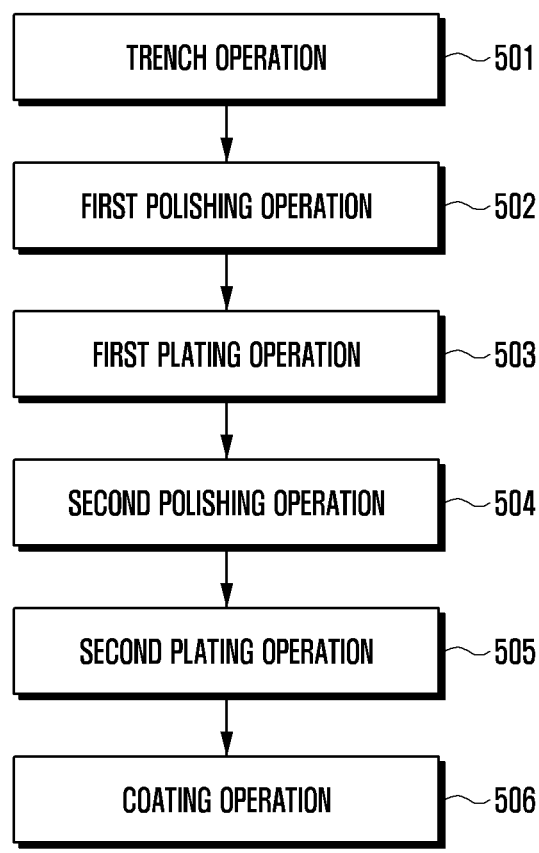
FIG. 5 is a flowchart of a manufacturing method, according to various embodiments.
Figure 6A:
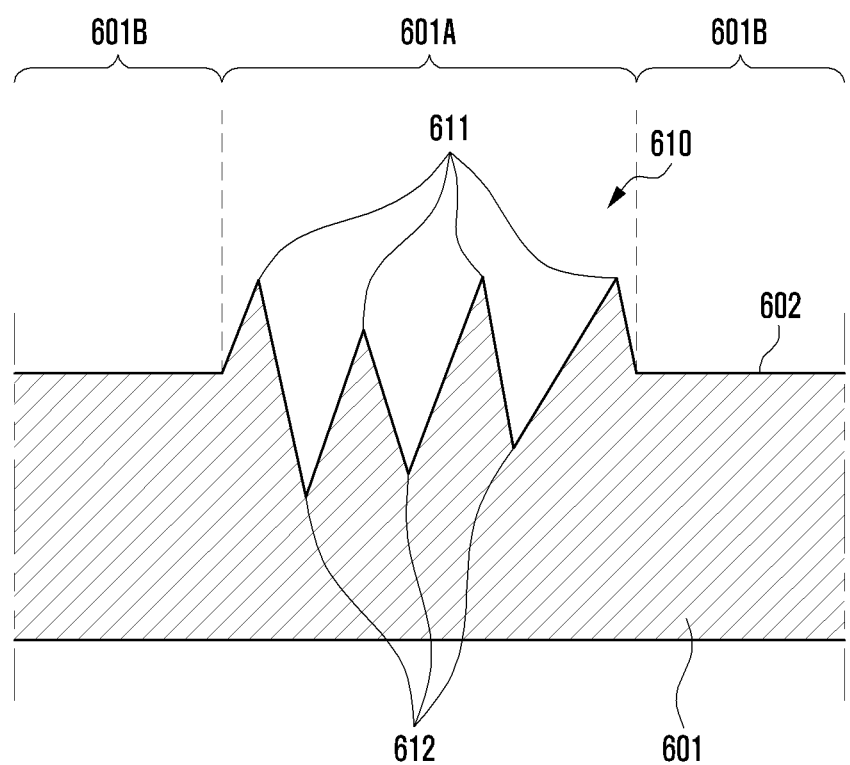
FIG. 6A is a diagram illustrating a trench formed, according to various embodiments.
Figure 6B:
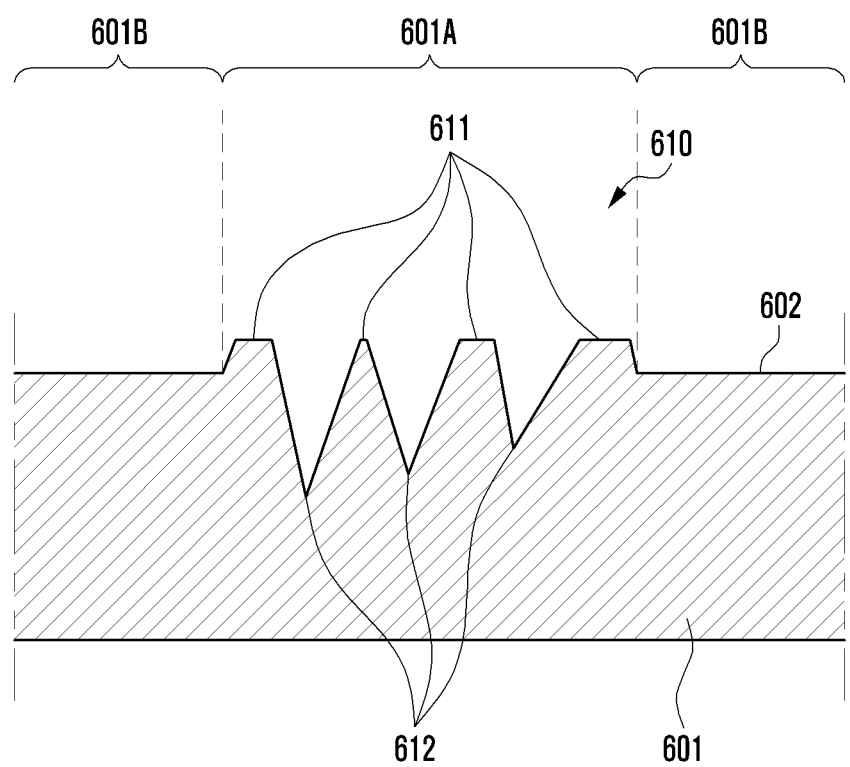
FIG. 6B is a diagram illustrating the trench of FIG. 6A to which a first polishing operation has been performed, according to various embodiments.
Figure 6C:
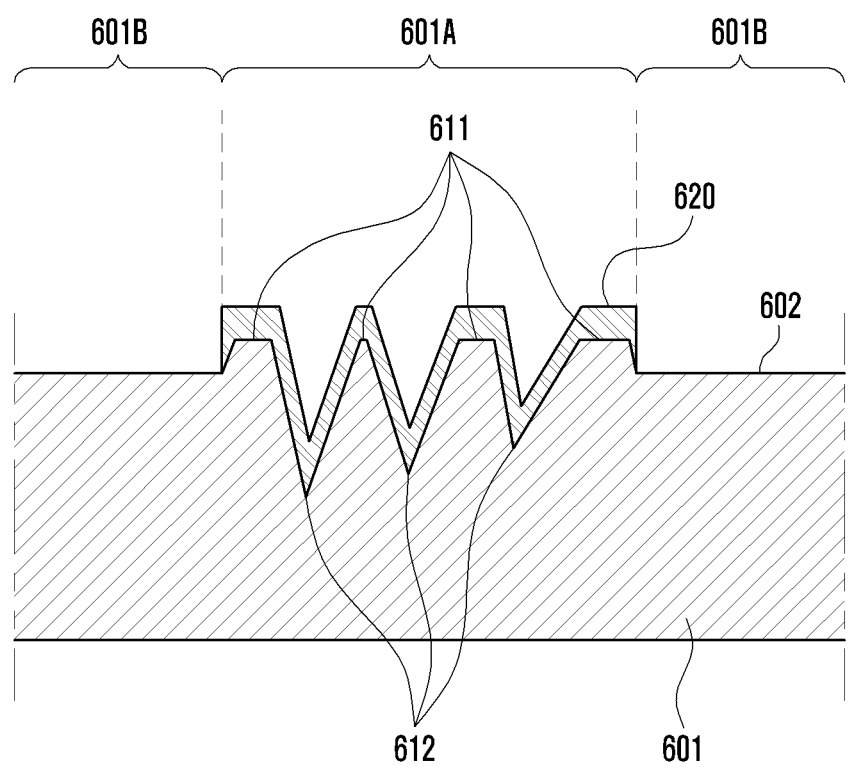
FIG. 6C is a diagram illustrating the polished trench of FIG. 6B to which a first plating operation has been performed, according to various embodiments.
Figure 6D:
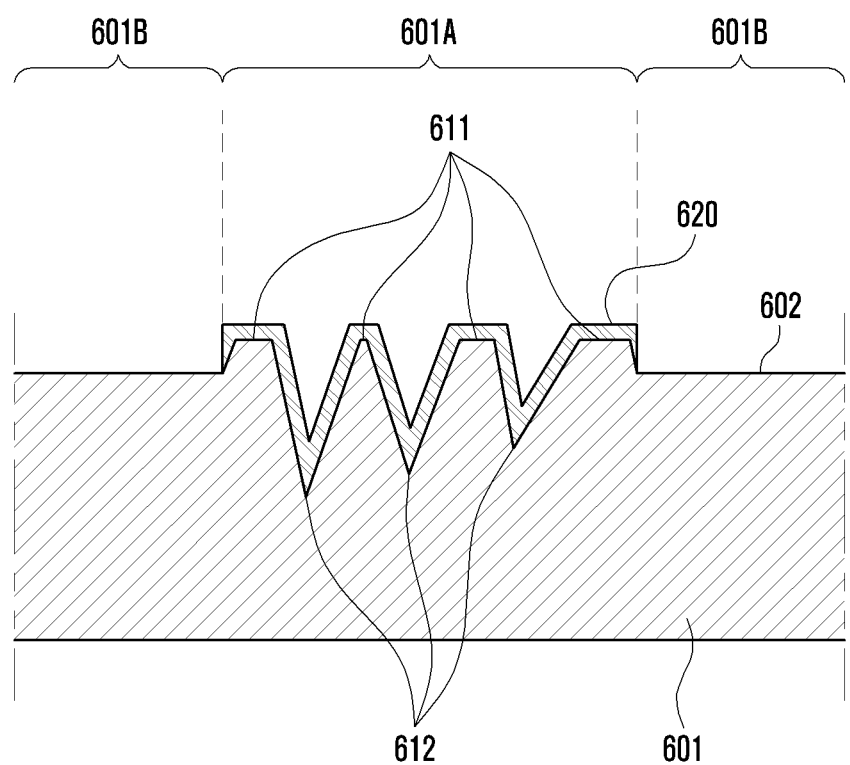
FIG. 6D is a diagram illustrating a first plating layer of FIG. 6C to which a second polishing operation has been performed, according to various embodiments.
Figure 6E:
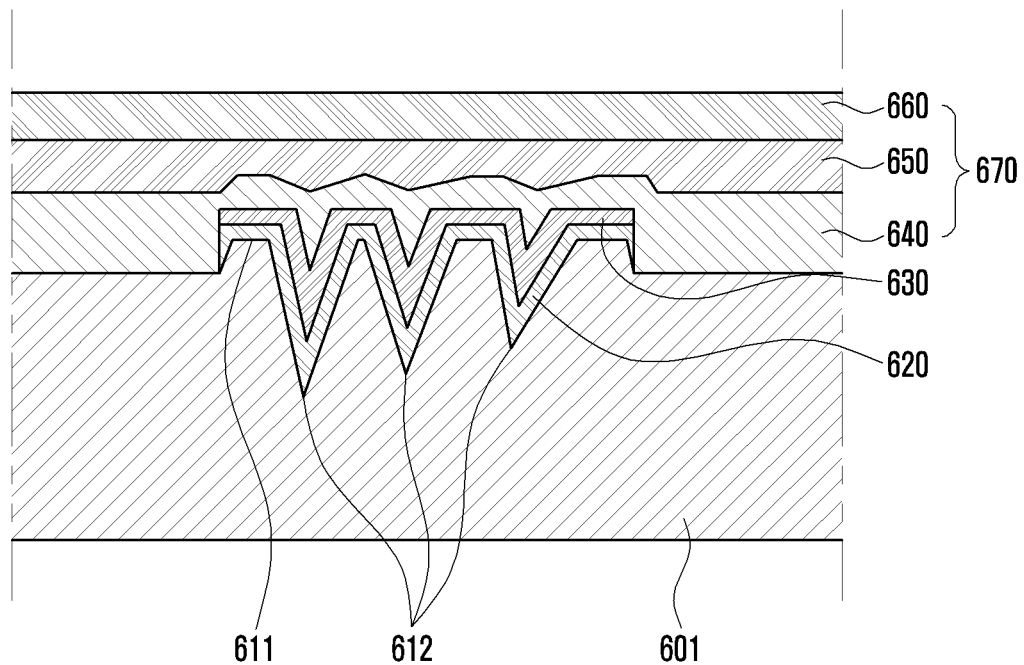
FIG. 6E is a diagram illustrating a result of performing a second plating operation and a coating operation, according to various embodiments.
Figure 7:
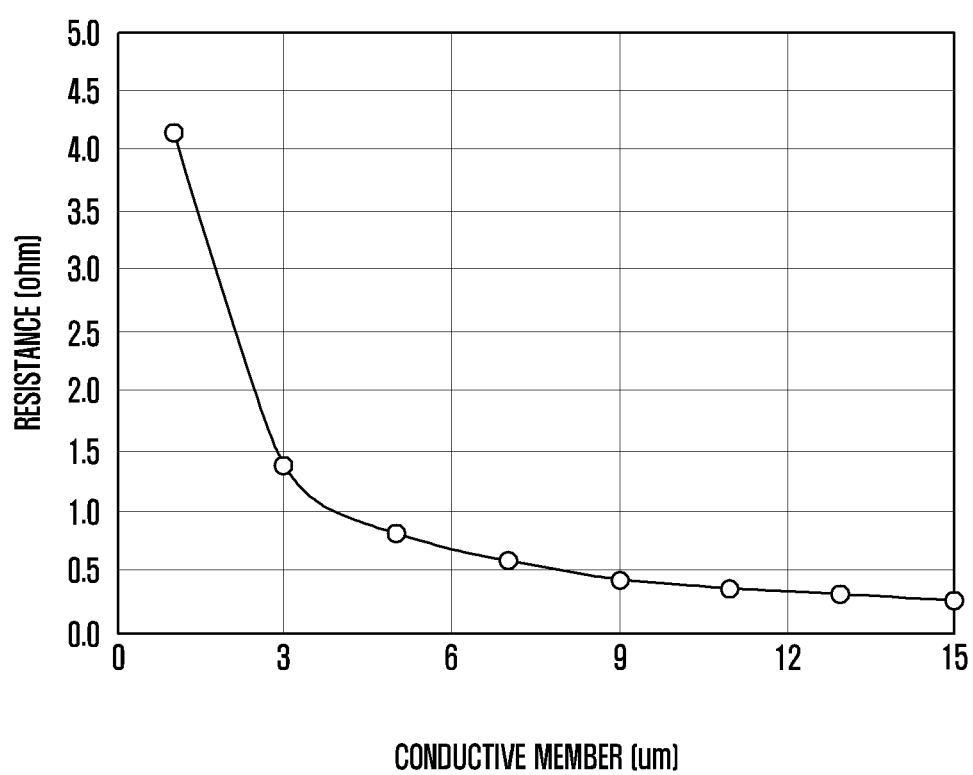
FIG. 7 is a graph showing the relation between the thickness and the performance of a conductive member, according to various embodiments.

FIG. 5 is a flowchart of a manufacturing method according to various embodiments. FIG. 6A is a diagram illustrating a trench formed according to various embodiments. FIG. 6B is a diagram illustrating the trench of FIG. 6A to which a first polishing operation has been performed. FIG. 6C is a diagram illustrating the polished trench of FIG. 6B to which a first plating operation has been performed. FIG. 6D is a diagram illustrating a first plating layer of FIG. 6C to which a second polishing operation has been performed. FIG. 6E is a diagram illustrating a result of performing a second plating operation and a coating operation according to various embodiments. FIG. 7 is a graph showing a relation between a thickness of a conductive member and the performance of the conductive member.

According to various embodiments, a conductive member (e.g., the conductive member 210 in FIG. 2) and a coating layer 670 (e.g., the coating layer 230 in FIG. 2) may be formed in a manufacturing method including a trench operation 501, a polishing operation (e.g., a first polishing operation 502 and a second polishing operation 504), a plating operation (e.g., a first plating operation 503 and a second plating operation 505), and a coating operation 506. The conductive member may include the first plating layer 620 and/or the second plating layer 630. The conductive member may be formed by the first plating layer 620 and/or the second plating layer 630. Thus, the conductive member may be substantially similar to the first plating layer 620 and/or the second plating layer 630.

According to various embodiments, the trench operation 501 may include an operation of forming a trench 610 in a plating area 601A of an outer housing 601. The trench 610 may refer to a fine uneven portion of the outer housing 601 that may include continuous peaks 611 and valleys 612, as shown in FIG. 6A. The peaks 611 may indicate portions of the outer housing 601 that are convex with respect to a reference surface 602. Alternatively or additionally, the valleys 612 may indicate portions of the outer housing 601 that are concave with respect to the reference surface 602.

The trench operation 501 may be performed through various process techniques. For example, the trench operation 501 may include irradiating the plating area 601A with a laser to form the trench 610. Alternatively or additionally, the trench operation 501 may include forming the trench 610 by chemically etching a portion of the plating area 601A using a solvent, such as, but not limited to, an etching process and/or a decapsulating process. In an optional or additional embodiment, the trench operation 501 may include forming the trench 610 by using a computerized numerical control (CNC) milling process of physically processing the plating area 601A through machining arithmetic. However, the present disclosure is not limited in this regard. That is, the trench 610 may be formed according to various other processes.

In an embodiment, the trench 610 may be formed by using laser as described above. In such an embodiment, the trench 610 may be formed by at least one of emission of a single laser beam, emission of at least two overlapping laser beams, and emission of at least two laser beams that are spaced apart from each other by a predetermined gap. However, the present disclosure is not limited in this regard. For example, the laser used to form the trench 610 may be emitted in various other manners.

According to various embodiments, the trench 610 may be formed such that the depth of the valleys 612 is approximately ten micrometers (e.g., 10 μm) to approximately fifteen (15) μM. Alternatively or additionally, the trench 610 may be formed such that the height of the peaks 611 is approximately eight (8) μm to approximately ten (10) μm.

As shown in FIG. 5, the first polishing operation 502 may be performed after the trench operation 501 has been performed. The first polishing operation 502 may include an operation of partially cutting the trench 610 formed in the plating area 601A in the trench operation 501. Referring to FIG. 6B, the peaks 611 of the trench 610 may be partially cut through the first polishing operation 502.

As shown in FIG. 5, the first plating operation 503 may be performed after the first polishing operation 502, has been performed. The first plating operation 503 may include at least one of degreasing, etching, neutralizing, catalyzing, and activating operations. The degreasing operation may refer to a cleaning operation that includes removing a foreign material, such as, but not limited to, grease, which may be included in the plating area 601A. The etching operation may refer to an operation that includes removing an oxide film formed on the surface of the plating area 601A. The neutralizing and catalyzing operations may refer to operations that include making a preparation so that the first plating layer 620 including a first metallic material is formed by plating on the plating area 601A having gone through the degreasing and etching operations. The neutralizing and catalyzing operations may refer to operations that include making a reduction reaction in the plating area 601A to enable the first metallic material to be deposited on the plating area 601A. The activating operation may refer to an operation that includes forming the first plating layer 620 in the plating area 601A. According to various embodiments, the first metallic material may include at least one of metallic materials such as, but not limited to, nickel (Ni), copper (Cu), and silver (Ag). For example, in the activating operation, the plating area 601A may be plated in the sequence of nickel-copper-silver (e.g., Ni—Cu—Ag). In such an example, the first plating layer 620 may be formed in the sequence of a nickel layer-a copper layer-a silver layer. In some embodiments, the use of silver as the first metallic material may reduce the cost of a plating process. According to various embodiments, when the trench 610 is formed, the valleys 612 may be formed to have a small depth, so that the amount of the first metallic material consumed in the first plating operation 503 may be reduced and the time required for the plating process may be reduced.

As shown in FIG. 5, the second polishing operation 504 may be performed after the first plating operation 503 has been performed. The second polishing operation 504 may refer to an operation that includes partially cutting the first plating layer 620. The portion of the first plating layer 620 that is cut in the second polishing operation 504 may be the first plating layer 620 formed on the peaks 611 of the trench 610, which have been partially cut through the first polishing operation 502. When a portion of the first plating layer 620 is cut in the second polishing operation 504, a step may be reduced. That is, when a portion remaining after excluding the plating area 601A of the outer housing 601 is a reference area 601B, the step between the plating area 601A and the reference area 601B may be reduced in the second polishing operation 504.

According to various embodiments, the second plating operation 505 may refer to a plating operation that includes forming the second plating layer 630 including a second metallic material. The second plating operation 505 is substantially the same as the first plating operation 503, and thus a detailed description is omitted for the sake of brevity. In an embodiment, the second metallic material may include a metallic material such as, but not limited to, nickel (Ni). In an optional or additional embodiment, the second metallic material may be a metallic material different from the first metallic material. Addition of the second plating operation 505 may result in a thicker conductive member and, as a result, may improve the performance of the conductive member.

Referring to FIG. 7, the thickness of the conductive member may be related to the performance of the conductive member. The conductive member may be formed by the first plating layer 620 formed by the first plating operation 503 and/or the second plating layer 630 formed by the second plating operation 505. As shown in FIG. 7, as the thickness of the conductive member increases, the resistance of the conductive member may decrease. Therefore, the electrical conductivity of the conductive member may be improved. Alternatively or additionally, as the surface of the conductive member becomes even (e.g., substantially flat), the performance of the conductive member may be improved. For example, in a case where the conductive member is used as an antenna pattern, as the surface of the conductive member becomes more even, the reflection coefficient of the conductive member may decrease. Therefore, the efficiency of the antenna may be improved.

In the manufacturing method discussed above with reference to FIG. 5, the first polishing operation 502 and the second polishing operation 504 may be performed after the formation of the trench 610 to obtain an even surface. That is, even when the same metallic material is used for the first plating layer 620 and the second plating layer 630, a conductive member having a desired thickness and even (e.g., substantially flat) surface may be obtained. Alternatively or additionally, the step caused by the formation of the trench 610 may be reduced through the polishing operation (e.g., the first polishing operation 502 and the second polishing operation 504), whereby the first plating layer 620 and the second plating layer 630 may have a reduced thickness. For example, the thickness of the conductive member including the first plating layer 620 and the second plating layer 630 may be approximately 11 μm to approximately 15 μm. In an embodiment, the thickness of a layer including copper (Cu) and silver (Ag) in the conductive member may be approximately 8 μm. As described above, the reduction of the thickness of the conductive member may reduce the step between the reference area 601B and the plating area 601A in which the conductive member is disposed. Therefore, a process for compensating for the step in the coating operation 506 for blocking external visibility of the conductive member may be simplified.

As shown in FIG. 5, the coating layer 670 may be formed, by the coating operation 506, on a first surface of the outer housing 601 including the plating area 601A in which the conductive member (e.g., the first plating layer 620 and the second plating layer 630) is disposed. Consequently, the conductive member may not be seen from the outside of the electronic device by being covered by the coating layer 670.

The coating operation 506 may include multiple operations. In an embodiment, the coating operation 506 may include at least one of a step compensation operation, a coloring operation, and a protecting operation. However, the present disclosure is not limited in this regard. For example, some operations of the coating operation 506 may be added and/or other operations may be omitted. According to various embodiments, the coating layer 670 may include a compensation layer 640, a color layer 650, and a protection layer 660.

According to various embodiments, the step compensation operation may refer to an operation for forming the compensation layer 640 to remove the step between the plating area 601A in which the conductive member is disposed, and the reference area 601B other than the plating area 601. For example, the compensation layer 640 may include a material such as, but not limited to, a primer or a surfacer. In an embodiment, the compensation layer 640 may reinforce the adhesion between the color layer 650 and the compensation layer 640 so as to prevent delamination of, from the compensation layer 640, the color layer 650 to be laminated on the compensation layer 640. Alternatively or additionally, a material included in the compensation layer 640 may include an anti-rust material.

According to various embodiments, the step between the plating area 601A and the reference area 601B may be compensated for by a predetermined amount in the polishing operation (e.g., the first polishing operation 502 and the second polishing operation 504). As such, a need to use a high cost material, such as putty, for step compensation may be reduced or eliminated. Consequently, it may be possible to reduce the manufacturing cost of the electronic device. In an embodiment, the compensation layer 640 may include two or more different primers. For example, two primers may be used. As a part of the step has been removed through the polishing operation (e.g., the first polishing operation 502 and the second polishing operation 504), the amount and the number of primers needed for step compensation may be reduced.

According to various embodiments, the coloring operation may refer to an operation that includes forming the color layer 650. The color layer 650 may be formed of a colored paint. The thickness of the color layer 650 may be configured to be in angstroms (Å), thereby making the color layer 650 be seen like a metal.

According to various embodiments, an operation of forming an ultra-violet (UV) coating layer (not shown) including a UV coating material may be included between the step compensation operation and the coloring operation.

According to various embodiments, the protecting operation may refer to an operation that includes forming the protection layer 660 on the color layer 650. The protecting operation may refer to an operation that includes forming a coating film on the color layer 650 so that the protection layer 660 protects the color layer 650.

The coating operation 506 described above is not limited in this regard. For example, some operations in the coating operation 506 described above may be omitted, and/or a material used in each operation may be variously changed as needed by design constraints.

Through the coating operation 506, the conductive member may be prevented from being seen from the outside of the electronic device. The step between the reference area 601B and the conductive member or the plating area 601A in which the conductive member is disposed may have been compensated for through the polishing operation (e.g., the first polishing operation 502 and the second polishing operation 504), and thus the surface step of the coating layer 670 may be reduced. The reduction of the step between the plating area 601A and the reference area 601B may reduce the visibility of the conductive member from the outside due to the step between a portion in which the conductive member is disposed and a portion in which same is not disposed.

The flowchart of the manufacturing method shown in FIG. 5 corresponds to an example, and it may be understood that the specific order of operations and/or the hierarchy of operations of the manufacturing method may be rearranged without deviating from the scope of the present disclosure. For example, some operations may be combined or omitted, and the partial sequence thereof may be changed. Furthermore, the use of the term "operation" may not limit the sequence of the process. For example, it may be understood that the term "operation" may refer to a "process" and/or an "action". Alternatively or additionally, other operations may be added. For example, a plating operation other than the first plating operation 503 and the second plating operation 505 may be added, and/or the second plating operation 505 may be omitted.

In an embodiment, a polishing operation may be performed two times by including a first polishing operation and a second polishing operation. However, the number of times that the polishing operation is performed may not be limited. For example, the polishing operation may be performed one (1) time. In this case, the polishing operation may be performed one time after the trench operation, may be performed one time after the first plating operation, or may be performed one time after the first plating operation and the second plating operation. For another example, the polishing operation may be performed three (3) or more times. In an optional or additional embodiment, the sequence for performing the polishing operation may be variously changed. For example, the polishing operation may be performed after the trench operation and before the first plating operation or the second plating operation. For another example, the polishing operation may be performed after the first plating operation. For yet another example, the polishing operation may be performed after the first plating operation or the second plating operation.

Alternatively or additionally, the coating operation 506 may be omitted.

Figure 8:
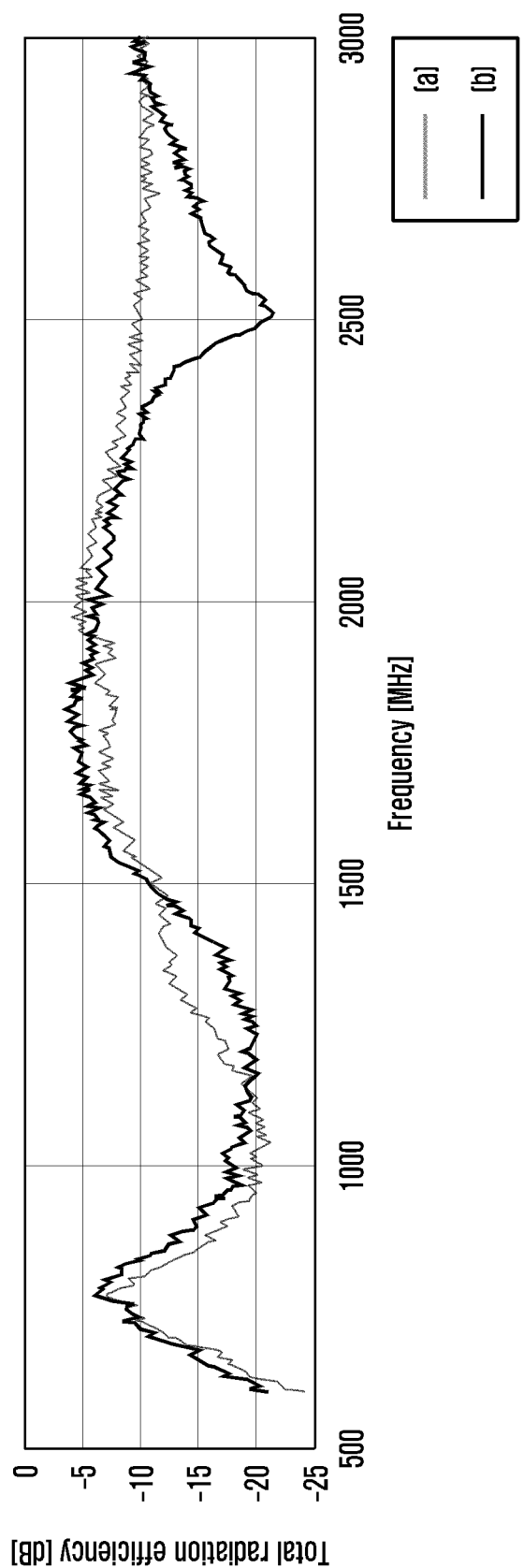
FIG. 8 is a graph comparing performance between an antenna disposed on a FPCB and a conductive member used as an antenna and formed according to various embodiments.

FIG. 8 is a graph comparing performance between an antenna disposed on a FPCB and a conductive member used as an antenna and formed according to various embodiments.

Graph (a) of FIG. 8 is an example of a performance graph of an antenna disposed on a flexible printed circuit board (FPCB), and graph (b) of FIG. 8 is an example of a performance graph of a conductive member formed using the manufacturing method described above with reference to FIGS. 5 to 6E. Referring to FIG. 8, it may be noted that the radiation efficiency of graph (b) is higher than graph (a) in the frequency range of approximately 700 MHz to approximately 800 MHz. This frequency band corresponds to band 28 in Long Term Evolution (LTE). Therefore, it may be noted that the conductive member may have an improved performance in a particular band, when compared to an antenna disposed on an FPCB.

Referring to FIG. 8, it may be further noted that the performance of the conductive member is generally higher than that of the FPCB in a sub-1 GHz band (low band). A part of an antenna, from which a signal is radiated, may be spaced apart from other electronic components of the electronic device. As described above, a conductive member may be formed on a housing (e.g., an injection object) that forms the exterior of an electronic device, and is used as an antenna. That is, a conductive member may be formed on the outer surface of an electronic device and may be usable as a radiator of an antenna. Thus, a high antenna radiation efficiency may be obtained.

Figure 9:
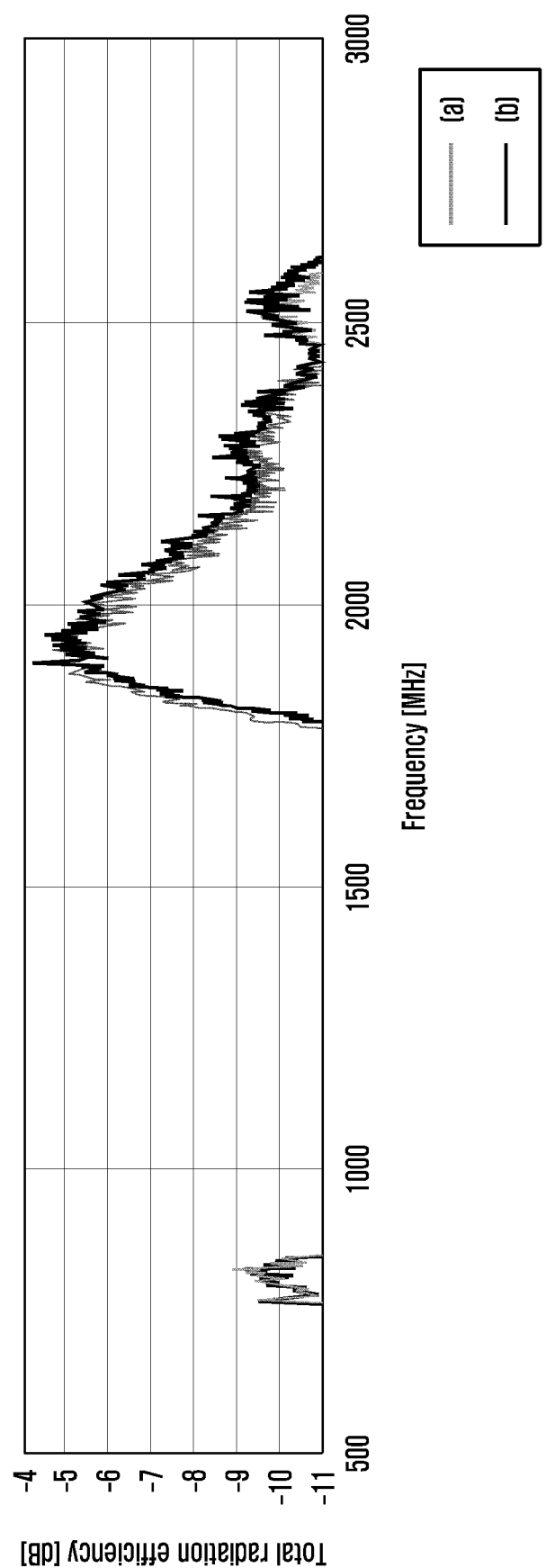
FIG. 9 is a graph comparing performance according to presence/absence of a coating layer in a case where a conductive member is used as an antenna, according to various embodiments.

FIG. 9 is a graph comparing performance according to presence/absence of a coating layer formed over a conductive member that is used as an antenna, according to various embodiments.

Both graph (a) and graph (b) of FIG. 9 are examples of performance graphs of a conductive member, which has been formed as described above with reference to FIGS. 5 to 6E, is used as an antenna. Graph (a) shows a case where a coating layer is formed, and graph (b) indicates a case where a coating layer is not formed. Referring to FIG. 9, the shapes of graph (a) and graph (b) are similar. Therefore, it may be noted that, even when a coating layer is formed in a plating area in which a conductive member is disposed, there is no significant impact on the performance of the conductive member.

Hereinafter, a method of manufacturing an electronic device is described with reference to FIGS. 10 to 15C.

Figure 10:
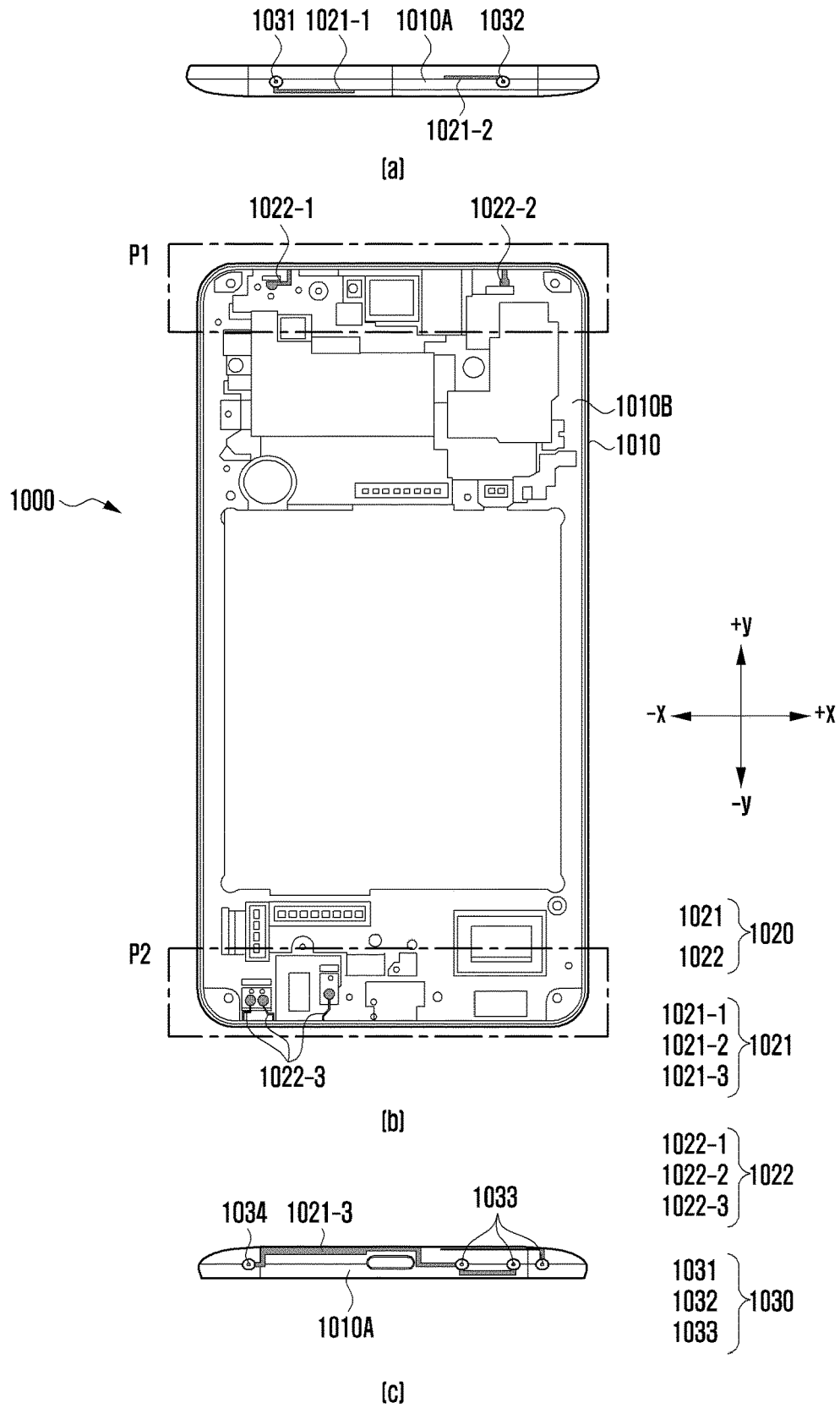
FIG. 10 is a diagram of a housing of an electronic device, according to various embodiments.
Figure 11A:
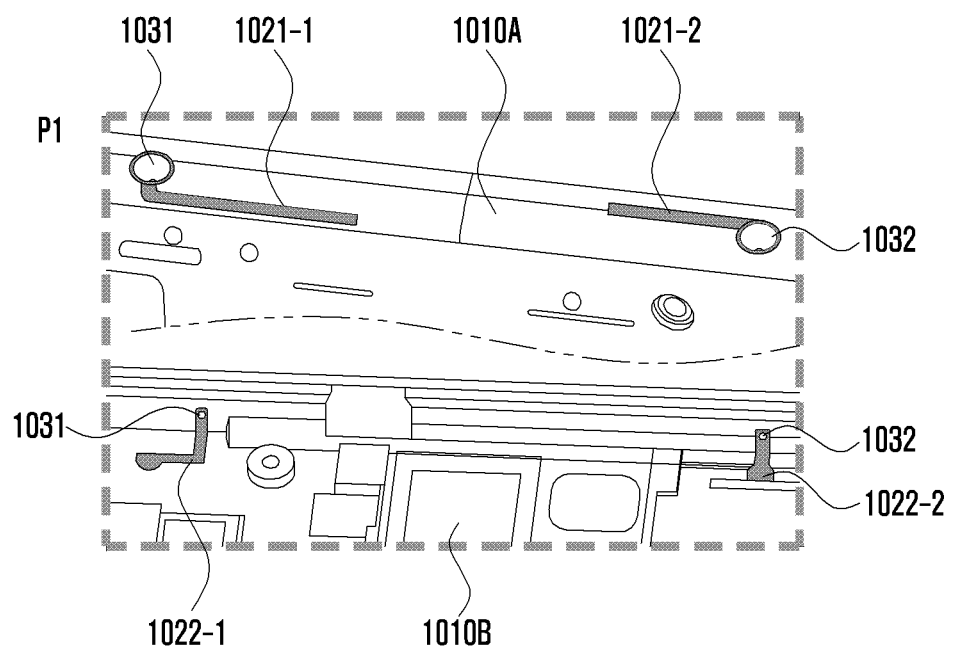
FIG. 11A is an enlarged view of a P1 part of FIG. 10, according to various embodiments.
Figure 11B:
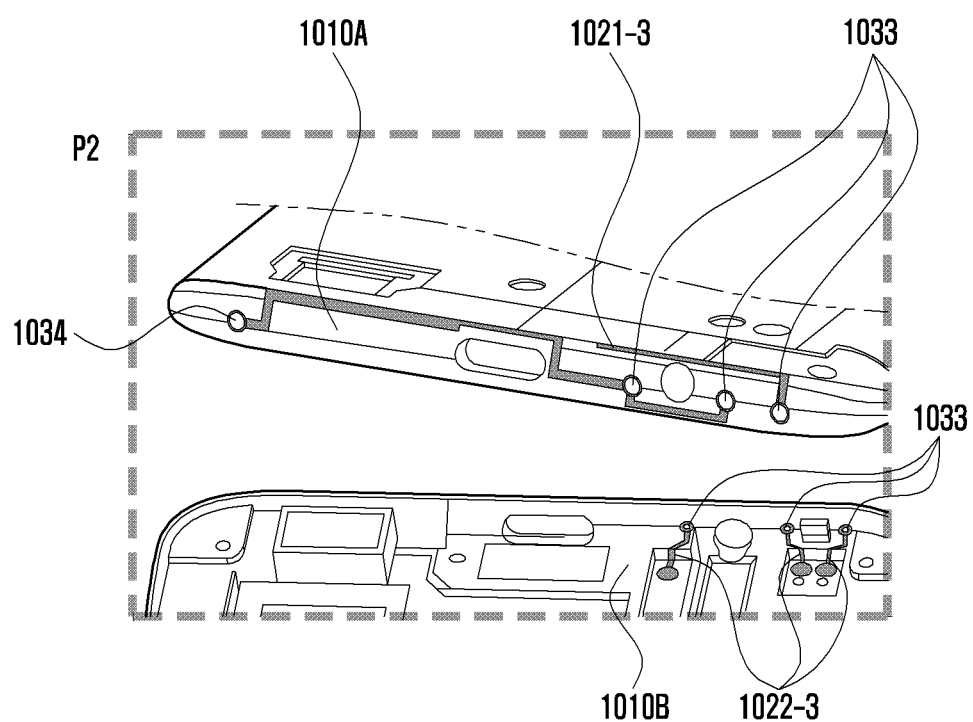
FIG. 11B is an enlarged view of a P2 part of FIG. 10, according to various embodiments.

FIG. 10 is a diagram of a housing of an electronic device, according to various embodiments. FIG. 11A is an enlarged view of a P1 part of FIG. 10, according to various embodiments. FIG. 11B is an enlarged view of a P2 part of FIG. 10, according to various embodiments.

According to various embodiments, a housing 1010 (e.g., the outer housing 201 in FIG. 2) of an electronic device 1000 (e.g., the electronic device 101 in FIG. 1 or the electronic device 200 in FIG. 2) may form at least a portion of an exterior of the electronic device 1000. The housing 1010 may be an element that accommodates and/or supports various electric objects (e.g., this is a collective name of various devices including an electronic component and thus including a conductive member) included in the electronic device 1000, and a structural object other than electric objects. The shape of the housing 1010 is not limited to the shape shown in FIG. 10. Alternatively or additionally, the housing 1010 may be manufactured according to various methods. For example, multiple parts may be separately manufactured and then coupled to each other to manufacture the housing 1010.

In an embodiment, the housing 1010 may include an outer surface 1010A and an inner surface 1010B. The inner surface 1010B of the housing 1010 may be a surface on which various electric objects and/or structural objects accommodated in the housing 1010 are accommodated, or by which same are supported. The outer surface 1010A of the housing 1010 may be a surface that is opposite to the inner surface 1010B of the housing 1010 and may form a portion of the exterior of the electronic device 1000. According to various embodiments, a conductive member 1020 may be disposed on the housing 1010.

Referring to FIGS. 10, 11A, and 11B, a first conductive member 1021 may be positioned (e.g., disposed) on the outer surface 1010A of the housing 1010. For example, the first conductive member 1021 may be at least partially formed on the outer surface 1010A of the housing 1010 by plating. A process by which the first conductive member 1021 is formed on the outer surface 1010A of the housing 1010 is described below. For example, as shown in FIG. 10, the first conductive member 1021 may be disposed on a part of the outer surface 1010A of an upper part (e.g., the P1 part of FIG. 10) of the housing 1010 and a lower part (e.g., the P2 part of FIG. 10) of the housing 1010. The outer shape of the first conductive member 1021 corresponds to an example, and the position of the first conductive member 1021 also corresponds to an example. That is, the present disclosure is not limited in this regard. As such, the shape and/or position of the first conductive member 1021 may be variously changed according to a design of the electronic device 1000.

Referring to FIGS. 10, 11A, and 11B, a second conductive member 1022 may be positioned on the inner surface 1010B of the housing 1010. For example, the second conductive member 1022 may be at least partially formed on the inner surface 1010B of the housing 1010 by plating. A process in which the second conductive member 1022 is formed on the inner surface 1010B of the housing 1010 is described below. For example, as shown in FIG. 10, the second conductive member 1022 may be disposed on a part of the outer surface 1010A of the upper part (e.g., the P1 part of FIG. 10) of the housing 1010 and the lower part (e.g., the P2 part of FIG. 10) of the housing 1010. The outer shape of the second conductive member 1022 corresponds to an example, and the position of the second conductive member 1022 also corresponds to an example. That is, the present disclosure is not limited in this regard. As such, shape and/or position of the second conductive member 1022 may be variously changed according to a design of the electronic device 1000.

According to various embodiments, a hole part 1030 may be disposed on the housing 1010. The hole part 1030 may be a hole extending through a part of the housing 1010. The hole part 1030 may be formed on the housing 1010 according to various methods. For example, in a case where the housing 1010 is formed by injection, the housing 1010 may be manufactured by using a mold including a part in which the hole part 1030 included in the housing 1010 is to be formed. Alternatively or additionally, the hole part 1030 may be formed by perforating the housing 1010 by using a separate processing tool. In an embodiment, a third conductive member 1023 may be disposed on the hole part 1030. For example, the third conductive member 1023 may be formed on the inner surface 1010B of the hole part 1030 by plating. The third conductive member 1023 disposed on the inner surface 1010B of the hole part 1030 may connect the first conductive member 1021 disposed on the outer surface 1010A of the housing 1010 to the second conductive member 1022 disposed on the inner surface 1010B of the housing 1010.

According to various embodiments, a third conductive member (e.g., the third conductive member 1023 in FIG. 12) disposed on the hole part 1030 may connect the first conductive member 1021 and the second conductive member 1022. For example, as shown in FIG. 11A, a (1-1)th conductive member 1021-1 may be connected to a (2-1)th conductive member 1022-1 by a third conductive member disposed on a first hole part 1031. A (1-2)th conductive member 1021-2 may be connected to a (2-2)th conductive member 1022-2 by a third conductive member disposed on a second hole part 1032. Referring to FIG. 11B, a (1-3)th conductive member 1021-3 may be connected to a (2-3)th conductive member 1022-3 by a third conductive member disposed on a third hole part 1033. A third conductive member (not shown) disposed on a fourth hole part 1034 may connect the (1-3)th conductive member 1021-3 disposed on the outer surface 1010A of the housing 1010 to the second conductive member 1022 disposed on the inner surface 1010B of the housing 1010. The connection of the conductive member 1020 may imply that the conductive member 1020 is physically connected (this connection includes continuous connection) and thus an electrical signal may be transferred through the conductive member 1020. For example, when the first conductive member 1021 is connected to the second conductive member 1022 through the third conductive member, an electrical signal having been transferred to the second conductive member 1022 may be transferred to the first conductive member 1021 through the third conductive member.

According to various embodiments, the conductive member 1020 may be used as an element of the electronic device 1000 requiring transfer of an electrical signal. For example, the conductive member 1020 may be used as an antenna for short-range and/or long-range communication of the electronic device 1000. For another example, the conductive member 1020 may be used as a wire electrically connecting various electronic components. For yet another example, the conductive member may be used as a touch sensor and/or a grip sensor for recognition of a capacitive touch input (e.g., the conductive member 410 in FIG. 4). However, the present disclosure is not limited in this regard. That is, the conductive member 1020 may be used as various elements requiring transfer of an electrical signal.

Figure 12:
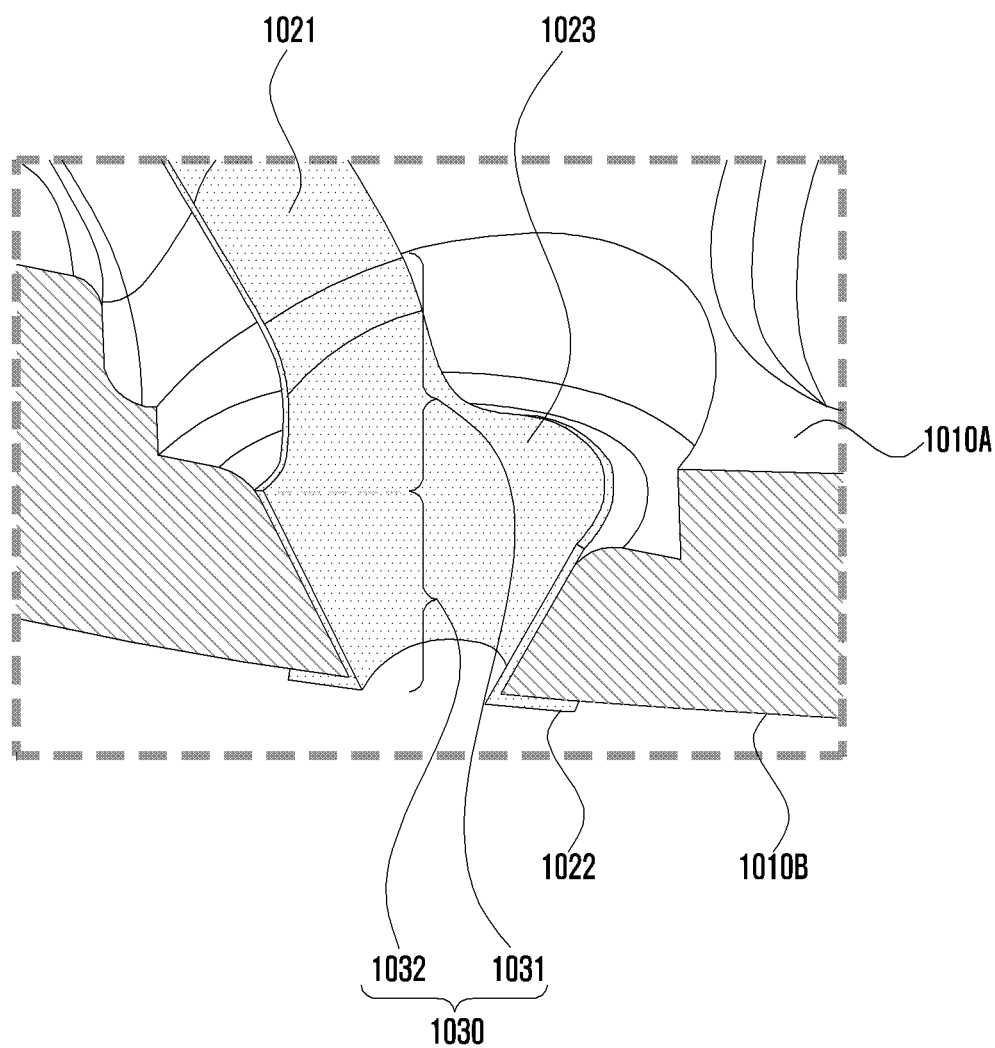
FIG. 12 is a cross sectional view of a partially cut hole part, according to various embodiments.
Figure 13A:
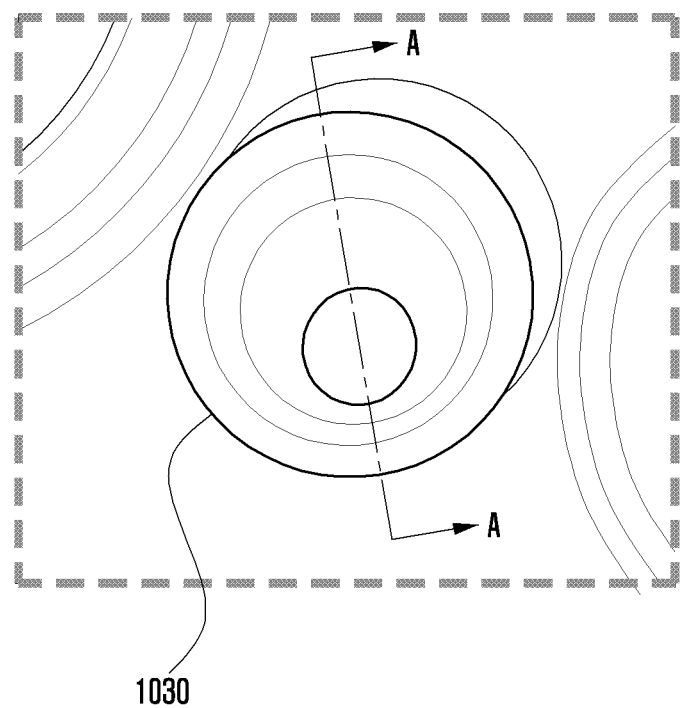
FIG. 13A is a diagram of a hole part when viewed in one direction, according to various embodiments.
Figure 13B:
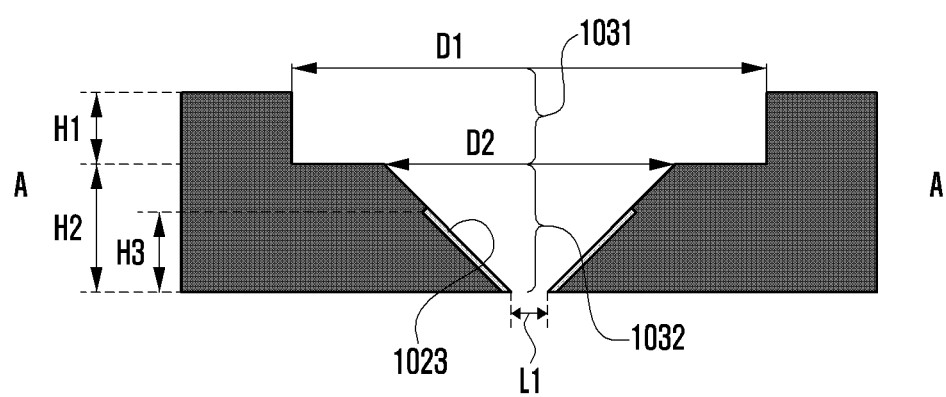
FIG. 13B is a cross sectional view of the hole part of FIG. 13A, after being cut along line A-A, according to various embodiments.
Figure 13C:
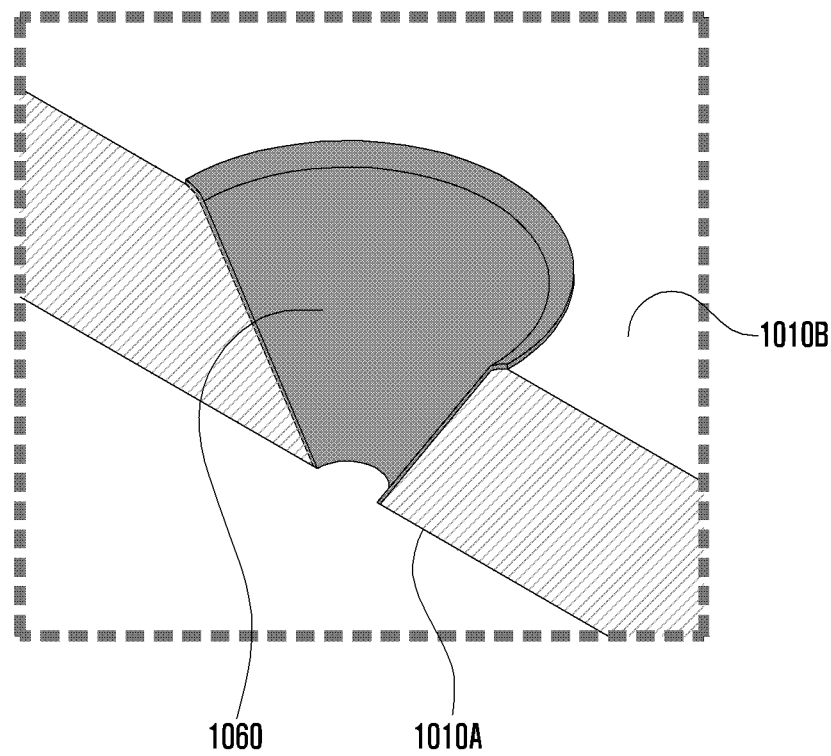
FIG. 13C is a diagram of an exemplary shape of the hole part of FIG. 13A, according to various embodiments.

FIG. 12 is a cross sectional view of a partially cut hole part according to various embodiments. FIG. 13A is a diagram of a hole part when viewed in one direction according to various embodiments. FIG. 13B is a cross sectional view of the hole part of FIG. 13A, after being cut along line A-A. FIG. 13C is a diagram of an exemplary shape of the hole part of FIG. 13A, according to various embodiments.

According to various embodiments, the hole part 1030 may be formed on the housing 1010. The third conductive member 1023 may be disposed in a partial area of an inner surface of the hole part 1030. As shown in FIG. 12, the third conductive member 1023 disposed on the inner surface of the hole part 1030 may connect the first conductive member 1021 disposed on the outer surface 1010A of the housing 1010 to the second conductive member 1022 disposed on the inner surface 1010B of the housing 1010.

According to various embodiments, the hole part 1030 may include a first part 1031 and a second part 1032. Referring to FIG. 12 and FIG. 13B, the first part 1031 may be a part adjacent to the inner surface 1010B of the housing 1010, and the second part 1032 may be a part adjacent to the outer surface 1010A of the housing 1010.

In an embodiment, the first part 1031 may be a part extending from the inner surface 1010B of the housing 1010 in a direction toward the outer surface 1010A of the housing 1010. The first part 1031 may have a first diameter D1. For example, the first diameter D1 may be approximately 1.5 millimeter (mm) to approximately 5.5 mm. The second part 1032 may be a part extending from an end of the first part 1031 in a direction toward the outer surface 1010A of the housing 1010. The second part 1032 may have a diameter gradually decreasing from a second diameter D2 in a direction toward the outer surface 1010A of the housing 1010. The height H2 of the second part 1032 may be approximately 20% to 50% of the entire height (e.g., H1+H2) of the hole part 1030.

In an embodiment, the height H1 of the first part 1031 may be different from the height H2 of the second part 1032. In another embodiment, the height H1 of the first part 1031 may be the same as the height H2 of the second part 1032.

In an embodiment, the second diameter D2 may be smaller than the first diameter D1. For example, the second diameter D2 may be approximately 1.0 mm to approximately 3.5 mm. The first diameter D1 of the first part 1031 and the second diameter D2 of a beginning part of the second part 1032 may be different from each other. Therefore, as shown in FIG. 13B, a step may exist between the first part 1031 and the second part 1032. This step may allow that, when a filler is injected into the first part 1031, the filler is fixed and received in the hole part 1030 without escaping from the hole part 1030. In an embodiment, a third diameter D3 that is the diameter of an ending point of the second part 1032 may be smaller than the second diameter D2. For example, the third diameter D3 may be approximately 0.4 mm to approximately 0.8 mm.

In an embodiment, the third conductive member 1023 may be disposed in a portion of the hole part 1030. The third conductive member 1023 may be disposed in a partial area of the inner surface of the hole part 1030. For example, referring to FIG. 13B, the third conductive member 1023 may be partially or entirely disposed in the second part 1032 on the inner surface of the hole part 1030. In an embodiment, the height H3 of a part in which the third conductive member 1023 is disposed may be about 30 to 100% of the height H2 of the second part 1032. Referring to FIG. 12, the third conductive member 1023 may be disposed on a part of the first part 1031 of the hole part 1030. As described above, the third conductive member 1023 may be disposed in only a part of the hole part 1030, whereby a filler occupying the hole part 1030 may be in direct contact with an inner wall of the hole part 1030 through a part in which the third conductive member 1023 is not disposed. For example, in a case where the filler and the housing 1010 are made of a synthetic resin material, the affinity between the filler and the housing 1010 may be relatively better than that of the filler and the third conductive member 1023. Therefore, when the filler is in direct contact with the inner wall of the hole part 1030, the filler may be more stably placed on the hole part 1030 compared to the contact with the third conductive member 1023.

Referring to FIG. 13C, a hole part 1060 may have a shape having a diameter changing from the inner surface 1010B of the housing to the outer surface 1010A. For example, as shown in FIG. 13C, the hole part 1060 may have a shape having a diameter decreasing from the inner surface 1010B of the housing to the outer surface 1010A.

The shape and dimension of the hole parts 1030 and 1060 described above correspond to an example, and the shape and dimension of the hole part 1030 may be variously changed according to various design elements.

Next, referring to FIGS. 14 and 15A to 15C, a process of forming a conductive member on a housing is described below.

Figure 14:
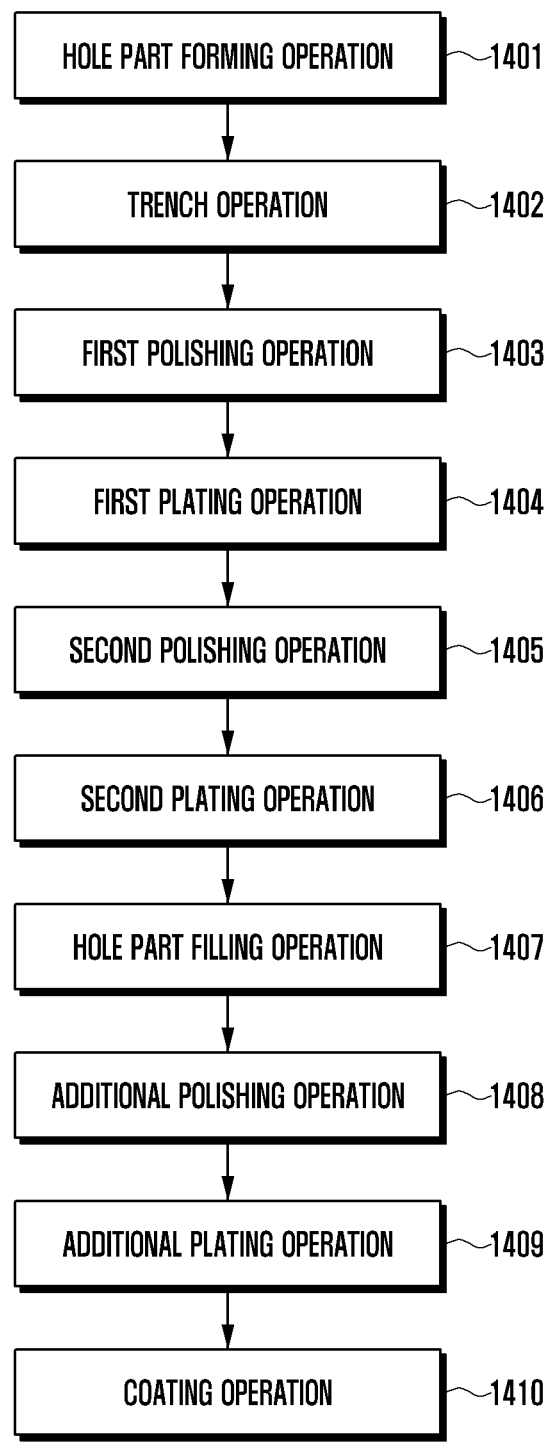
FIG. 14 is a flowchart of a method of manufacturing an electronic device, according to various embodiments.
Figure 15A:
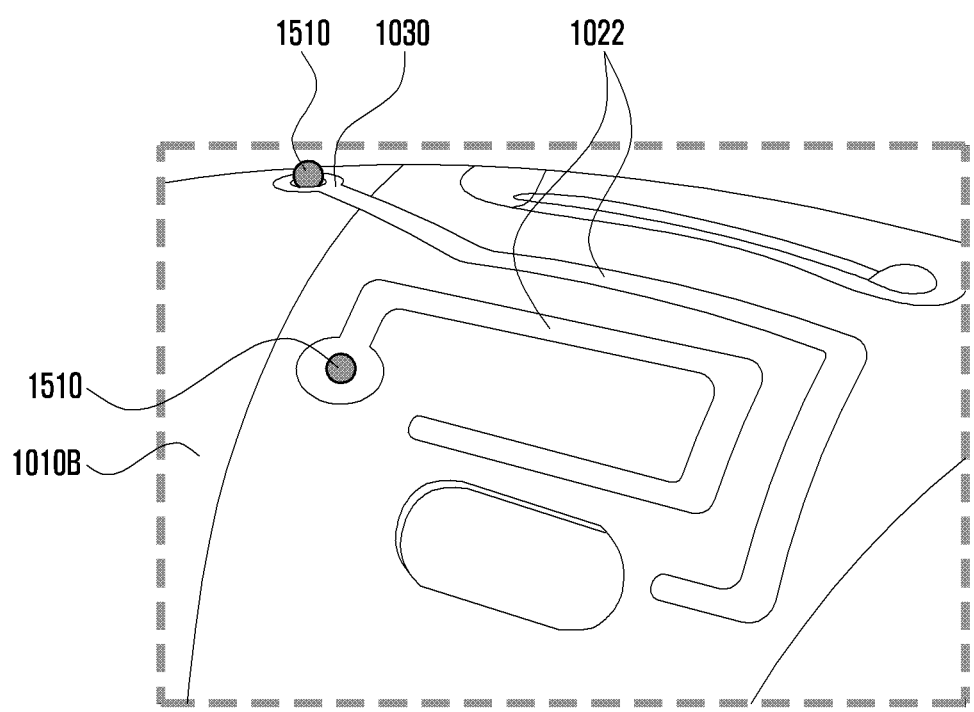
FIGS. 15A to 15C are diagrams illustrating a conductive member being formed according to a method of manufacturing an electronic device, according to various embodiments.
Figure 15B:
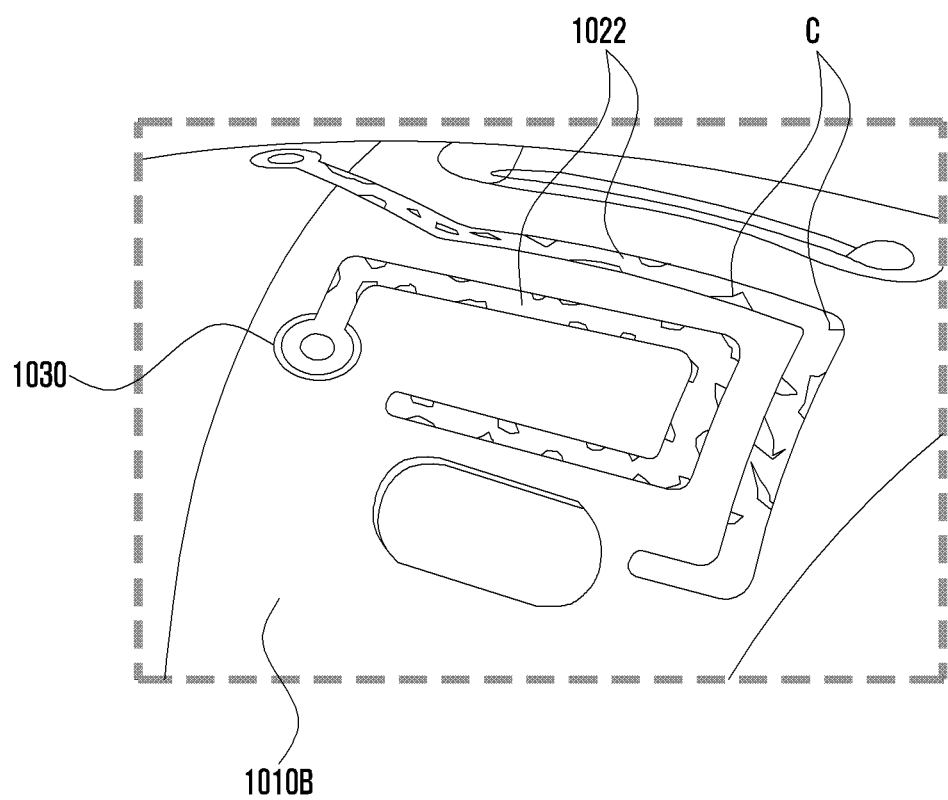
Figure 15C:
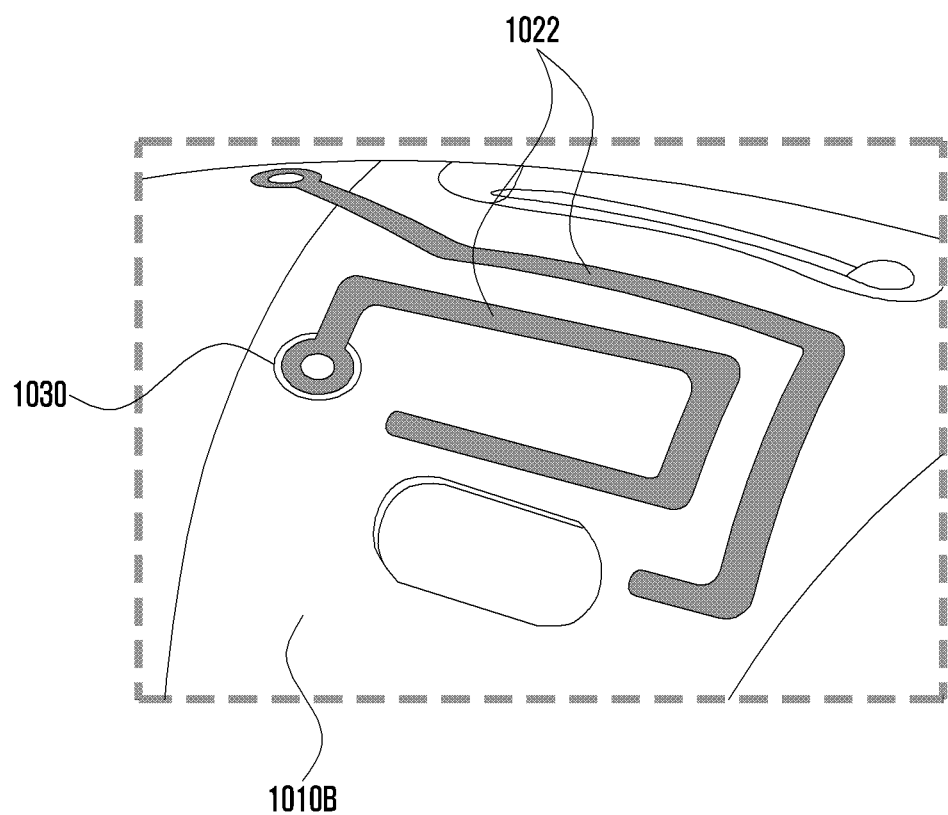

FIG. 14 is a flowchart of a method of manufacturing an electronic device according to various embodiments. FIG. 15A to FIG. 15C are diagrams illustrating a conductive member being formed according to a method of manufacturing an electronic device according to various embodiments.

In the following description, the term "plating area" may refer to an area in which plating is performed, and may indicate a part in which the conductive member 1020 is disposed. Therefore, a first plating area below may be understood as a part in which the above first conductive member 1021 is disposed, a second plating area may be understood as a part in which the above second conductive member 1022 is disposed, and a third plating area may be understood as a part in which the above third conductive member 1023 is disposed. Hereinafter, a plating area corresponding to the conductive member 1020 is described using the same reference numeral are that of the conductive member. Example positions of the plating area are shown in FIGS. 10, 11A, and 11B.

In addition, a process of forming a conductive member described below may be similar to the process described above with reference to FIG. 5. Therefore, the process of forming the conductive member is described with reference to FIG. 5, and a detailed description is omitted for the sake of brevity.

Furthermore, the flowchart of FIG. 14 corresponds to an example. As such, it is to be understood that the specific order or hierarchy of operations in FIG. 14 are an illustration of exemplary approaches. For example, the specific order or hierarchy of operations may be rearranged based upon design preferences. Further, some operations may be omitted or combined.

According to various embodiments, the hole part 1030 may be formed on a housing (e.g., the housing 1010 in FIG. 10) (operation 1401). The hole part 1030 formed on the housing may be formed in various methods. For example, a housing having the hole part 1030 formed thereon may be formed by making the housing in an injection method by using a mold considering the hole part 1030, or the hole part 1030 may be formed on a housing with a processing tool. The hole part 1030 may be formed according to various other methods.

According to various embodiments, a trench (e.g., the trench 610 in FIG. 6A) may be formed in a partial area of the housing (operation 1402). The trench may indicate a fine uneven portion including continuous peaks (e.g., the peaks 611 in FIG. 6A) and valleys (e.g., the valleys 612 in FIG. 6A). In a first plating operation 1404, a plating layer (e.g., the plating layer 620 in FIG. 6D) may be formed on a part on which the trench is formed. Therefore, trenches may be formed in a first plating area (e.g., an area in which the first conductive member 1021 is disposed in FIG. 10) in which the first conductive member 1021 may be disposed, a second plating area (e.g., an area in which the second conductive member 1022 is disposed in FIG. 10) in which the second conductive member 1022 may be disposed, and a third plating area (e.g., an area in which the third conductive member 1023 is disposed in FIG. 12) in which the third conductive member 1023 may be disposed. As described with reference to FIG. 12, the third conductive member 1023 may be formed in only a partial area of the inner surface of the hole part 1030. A trench may be formed in only a partial area of the inner surface 1010B of the hole part 1030, whereby the third conductive member 1023 may be formed in only a partial area of the inner surface of the hole part 1030.

According to various embodiments, a first polishing operation 1403 may be performed. The first polishing operation 1403 may refer to an operation including partially cutting a trench. For example, the trenches formed in the first plating area, the second plating area, and the third plating area may be cut. The first polishing operation 1403 may refer to an operation considering the quality of a coating layer (e.g., the coating layer 670 in FIG. 6E) formed in a coating operation 1410. Therefore, the first polishing operation 1403 may be performed only in the first plating area in which a coating layer is formed.

As shown in FIG. 14, the first plating operation 1404 may be performed after the first polishing operation 1403 has been performed. The first plating operation 1404 may refer to an operation that includes forming a first plating layer (e.g., the first plating layer 620 in FIG. 6D) including a first metallic material in the first plating area, the second plating area, and the third plating area. The first plating layer formed in a plating area through the first plating operation 1404 may form a part of a conductive member.

A second polishing operation 1405 may be performed after the first plating operation 1404 has been performed, as shown in FIG. 14. The second polishing operation 1405 may refer to an operation that includes partially cutting the first plating layer formed in the first plating operation 1404. The second polishing operation 1405 may refer to an operation considering the quality of a coating layer. Therefore, the second polishing operation 1405 may be performed only in the first plating area in which a coating layer is formed.

As shown in FIG. 14, a second plating operation 1406 may be performed after the second polishing operation 1405 has been performed. The second plating operation 1406 may refer to a plating operation that includes forming a second plating layer (e.g., the second plating layer 630 in FIG. 6E) including a second metallic material in a plating area. The second plating operation 1406 may refer to a plating operation similar to the first plating operation 1404.

According to various embodiments, a hole part filling operation 1407 may be performed after the second plating operation 1406 has been performed. The hole part filling operation 1407 may refer to an operation that includes filling the hole part 1030 with a filler. In an embodiment, the filler may be a synthetic resin material. For example, the filler may be a light curing resin (e.g., UV resin). The filler may occupy the hole part 1030 according to various methods. For example, the filler may occupy the hole part 1030 with various devices, such as, but not limited to, a dispensing device, a pumping device, or a jet pumping device, which are capable of injecting a melted liquid to a particular space. In an embodiment, the filler may be injected into a first part (e.g., the first part 1031 in FIG. 12) of the hole part 1030. The filler injected into the first part 1031 may partially protrude (e.g., as indicated by reference numeral 1510) from the outer surface 1010A of the housing 1010 through a second part (e.g., the second part 1032 in FIG. 12), as shown in FIG. 15A. According to various embodiments, after the filler is applied, a post processing operation including a process of curing the filler may be performed. Various methods may be used to cure the filler, according to the type of the filler. For example, the post processing operation of curing the filler may be performed using at least one of light, heat, or catalyst.

As shown in FIG. 14, an additional polishing operation 1408 may be performed after the hole part filling operation 1407 has been performed. The additional polishing operation 1408 may refer to an operation that includes removing a protrusion 1510 of the filler partially protruding from the outer surface 1010A of the housing 1010 through the hole part filling operation 1407 performed before. Referring to FIG. 15B, the protrusion 1510 of the filler may be removed by the additional polishing operation 1408. One or more flaws C may be formed on a part of the plating layer disposed in the first plating area 1021 of the outer surface 1010A of the housing 1010. The flaws C may cause unevenness of the surface of the plating layer in the first plating area 1021.

According to various embodiments, an additional plating operation 1409 may be performed after the additional polishing operation 1408 has been performed. The additional plating operation 1409 may refer to a plating operation that includes compensating for the flaw C formed on the surface of the plating layer in the first plating area 1021 in the additional polishing operation 1408. A new plating layer may be formed on the surface of the plating layer in the first plating area 1021 by the additional plating operation 1409. Thus, as shown in FIG. 15C, the surface flatness of the plating layer in the first plating area 1021 may be improved.

As shown in FIG. 14, an additional coating operation 1410 may be performed after the additional plating operation 1409 has been performed. The coating operation 1410 may refer to an operation that includes forming a coating layer on at least a part of the outer surface 1010A of the housing 1010. Referring to FIG. 6E, the first plating area 1021 may be covered by the coating layer disposed on the outer surface 1010A of the housing 1010. In various embodiments, the surface flatness of the outer surface 1010A of the housing 1010 may be improved through a polishing operation (e.g., the first polishing operation 1403, the second polishing operation 1405, and the additional polishing operation 1408) and the hole part filling operation 1407. A coating layer may be formed on the outer surface 1010A of the housing 1010 which has been evenly processed, whereby the quality of the coating layer may be improved.

A method of manufacturing an electronic device, according to various embodiments, may include a trench operation of forming a trench in a plating area that is at least a partial area of a first surface of an outer housing at least partially forming an exterior of the electronic device, the first surface being exposed to the outside, a first plating operation of forming a first plating layer including a first metallic material in the plating area, a polishing operation of polishing the plating area, and a coating operation of forming a coating layer on the first surface of the outer housing.

In some embodiments, the polishing operation may include a first polishing operation of polishing the plating area before the first plating operation and a second polishing operation of polishing the plating area after the first plating operation.

In some embodiments, the operation of forming the trench may be performed by emitting laser to form a fine uneven part including continuous peaks and valleys in the plating area.

In some embodiments, the polishing operation may be an operation of cutting at least one of a part of a peak of the fine uneven part and a part of the first plating layer so as to reduce a step between the plating area and a reference area other than the plating area.

In some embodiments, the method may further include a second plating operation of operation.

In some embodiments, the first metallic material may include at least one of metallic materials including nickel (Ni), copper (Cu), and silver (Ag).

In some embodiments, the second metallic material may include a metallic material including nickel (Ni).

In some embodiments, the coating operation may include a step compensation operation of forming a compensation layer on the first surface so as to compensate for a step on the first surface of the outer housing, a coloring operation of forming a color layer having a color on the compensation layer, and a protecting operation of forming a protection layer on the color layer to protect the color layer.

In some embodiments, the step compensation operation of the coating operation may include forming the compensation layer by using different types of primers.

A method of manufacturing an electronic device, according to various embodiments, may include a trench operation of forming a trench in a plating area that is at least a partial area of a second surface of an outer housing at least partially forming an exterior of the electronic device, the second surface being opposite to a first surface exposed to the outside, a polishing operation of polishing the plating area, and a first plating operation of forming a first plating layer including a first metallic material in the plating area.

In some embodiments, the polishing operation may include a first polishing operation of polishing the plating area before the first plating operation and a second polishing operation of polishing the plating area after the first plating operation.

In some embodiments, the method may further include a second plating operation of operation.

In some embodiments, the plating area may be an area facing a heat radiating component of the electronic device.

An electronic device, according to various embodiments, may include an outer housing forming an exterior of the electronic device, a conductive member disposed in a plating area that is at least a partial area of a first surface of the outer housing, which is exposed to the outside, and a coating layer disposed on the first surface to cover the conductive member disposed in the plating area.

In some embodiments, the conductive member and the coating layer may be formed by a manufacturing method including a trench operation of forming a trench in the plating area, a first plating operation of forming a first plating layer including a first metallic material in the plating area, a polishing operation of polishing the plating area, and a coating operation of forming a coating layer on the first surface of the outer housing.

In some embodiments, the polishing operation of the manufacturing method may include a first polishing operation of polishing the plating area before the first plating operation and a second polishing operation of polishing the plating area after the first plating operation.

In some embodiments, the trench operation of the manufacturing method may be performed by emitting laser to form a fine uneven part including continuous peaks and valleys in the plating area.

In some embodiments, the polishing operation of the manufacturing method may be an operation of cutting at least one of a part of a peak of the fine uneven part and a part of the first plating layer so as to reduce a step between the plating area and a reference area other than the plating area.

In some embodiments, the manufacturing method may further include a second plating operation of forming a second plating layer including a second metallic material after the second polishing operation.

In some embodiments, the plating area may be an area thicker than other areas of the outer housing.

A method of manufacturing an electronic device, according to various embodiments, may include an operation of forming a hole part on a housing forming at least a part of an exterior of the electronic device, a trench operation of forming a trench in a first plating area that is at least a partial area of an outer surface of the housing, forming a trench in a second plating area that is at least a partial area of an inner surface of the housing, and forming a trench in a third plating area that is connected to the first plating area and the second plating area and is at least a partial area of an inner surface of the hole part formed in the electronic device, a first plating operation of forming a first plating layer including a first metallic material in at least one of the first plating area, the second plating area, and the third plating area, a polishing operation of polishing the first plating area, a filling operation of filling the hole part with a filler, an additional polishing operation of polishing the first plating area including a part of the filler protruding from the outer surface of the housing by occupying the hole part, and an additional plating operation of plating the first plating area.

In some embodiments, the polishing operation may include a first polishing operation of polishing the plating area before the first plating operation and a second polishing operation of polishing the plating area after the first plating operation.

In some embodiments, the method may further include a second plating operation of operation.

In some embodiments, the third plating area may correspond to a partial area of the inner surface of the hole part, and an area remaining after excluding the third plating area from the inner surface of the hole part may come into direct contact with the filler.

In some embodiments, the hole part may include a first part extending with a first diameter from the inner surface of the housing in a direction toward the outer surface of the housing, and a second part having a diameter gradually decreasing from a second diameter smaller than the first diameter from an end of the first part in a direction toward the outer surface of the housing.

In some embodiments, the method may further include a coating operation of forming a coating layer on the outer surface of the housing.

An electronic device, according to various embodiments, may include a housing forming at least a part of an exterior of the electronic device and including a hole part, a first conductive member formed in at least a partial area of an outer surface of the housing by plating, a second conductive member formed in at least a partial area of an inner surface of the housing by plating, a third conductive member formed in at least a partial area of an inner surface of the hole part by plating so as to connect the first conductive member and the second conductive member, and a coating layer disposed on the outer surface of the housing.

In some embodiments, the third conductive member is disposed in a partial area of the inner surface of the hole part, and an area remaining after excluding, from the inner surface of the hole part, a part in which the third conductive member is disposed is in direct contact with a filler occupying the hole part.

In some embodiments, the hole part may include a first part extending with a first diameter from the inner surface of the housing in a direction toward the outer surface of the housing, and a second part having a diameter gradually decreasing from a second diameter smaller than the first diameter from an end of the first part in a direction toward the outer surface of the housing.

An aspect of the present disclosure provides an electronic device that may indicate a structural object forming an exterior of the electronic device. An aspect of the present disclosure provides an electronic device. For example, an electronic device case may include an outer housing, a conductive member with which a trench formed on the outer housing is plated, and a coating layer.

The embodiments of the present disclosure, which are described and shown in the specification and the drawings, have presented specific examples in order to easily explain the technical contents of embodiments and help understanding of embodiments, and are not intended to limit the scope of embodiments. Therefore, the scope of various embodiments should be construed to include, in addition to the embodiments, all changes and modifications that are derived based on the technical idea of various embodiments.

What is claimed is:

1. An electronic device, comprising:
   an outer housing at least partially forming an exterior of the electronic device;
   a trench comprising:
      at least one valley, wherein each of the at least one valley is concave with respect to a surface of the outer housing; and
      at least one peak, wherein each of the at least one peak is convex with respect to the surface of the outer housing and has a partially removed end;
   a first conductive member; and
   a coating layer laminated on the outer housing and disposed on the first conductive member,
   wherein the trench is plated with the first conductive member.

2. The electronic device of claim 1, wherein the first conductive member comprises an area corresponding to a portion of the at least one peak has been partially removed.

3. The electronic device of claim 1, further comprising a second conductive member disposed between the first conductive member and the coating layer.

4. The electronic device of claim 1, wherein:
   a first area of a first surface of the outer housing comprises the trench, the first conductive member, and the coating layer, and
   a second area of a second surface opposite to the first surface of the outer housing is plated with a second conductive member.

5. The electronic device of claim 4, further comprising:
   a hole part disposed on the outer housing; and
   a third conductive member plated at the hole part and coupling the first conductive member to the second conductive member.

6. The electronic device of claim 5, wherein:
   the third conductive member is plated on a portion of an inner surface of the hole part, and
   a remaining portion of the inner surface of the hole part is in contact with a filler occupying the hole part.

7. The electronic device of claim 5, wherein the hole part comprises:
   a first part extending from the second surface of the outer housing in a direction toward the first surface of the outer housing; and
   a second part extending from an end of the first part in the direction toward the first surface of the outer housing,
   wherein the second part has a diameter gradually decreasing from a second diameter, and
   wherein the second diameter is smaller than a first diameter of the first part.

8. A method of manufacturing an electronic device, the method comprising:
   forming a first trench in a first plating area of a first surface of an outer housing at least partially forming an exterior of the electronic device, the first surface being exposed to the outside;
   forming, in a plating area, a first plating layer comprising a first metallic material, the plating area comprising at least one of the first plating area, a second plating area, and a third plating area;
   polishing the first plating area; and
   forming a coating layer on the first surface of the outer housing.

9. The method of claim 8, wherein the polishing of the first plating area comprises:
   polishing the first plating area before the forming of the first plating layer; and
   polishing the first plating area after the forming of the first plating layer.

10. The method of claim 9, wherein the polishing of the first plating area comprises cutting at least one of a first portion of a peak of the first trench and a second portion of the first plating layer.

11. The method of claim 9, wherein the polishing of the first plating area comprises reducing a step between the first plating area and a reference area other than the first plating area.

12. The method of claim 8, wherein the forming of the coating layer comprises:
   forming, using at least two distinct primers, a compensation layer on the first surface thereby compensating for a step on the first surface of the outer housing;
   forming a color layer having a color on the compensation layer; and
   forming a protection layer on the color layer.

13. The method of claim 8, further comprising:
   forming a hole part on the outer housing; and
   forming a second trench in the second plating area of a second surface opposite to the first surface of the outer housing and the third plating area of an inner surface of the hole part.

14. The method of claim 13, further comprising:
   the hole part with a filler; and
   polishing a portion of the filler protruding from an outer surface of the outer housing.

15. A case of an electronic device, comprising:
   an outer housing;
   a trench comprising:
      a valley that is concave with respect to a surface of the outer housing; and
      a peak that is convex with respect to the surface of the outer housing and has a partially removed end;
   a first conductive member; and
   a coating layer laminated on the outer housing and disposed on the first conductive member,
   wherein the trench is plated with the first conductive member.

16. The case of claim 15, further comprising a second conductive member disposed between the first conductive member and the coating layer.

17. The case of claim 16, wherein the case further comprises:
   a hole part disposed on the outer housing; and
   a third conductive member plated at the hole part and coupling the first conductive member to the second conductive member,
   wherein a first area of a first surface of the outer housing comprises the trench, the first conductive member, and the coating layer, and
   wherein a second area of a second surface opposite to the first surface of the outer housing is plated with the second conductive member.

18. The case of claim 17, wherein:
the third conductive member is plated on a portion of an inner surface of the hole part, and
a remaining portion of the inner surface of the hole part is in contact with a filler occupying the hole part.

19. The case of claim 17, wherein the hole part comprises:
a first part extending from the second surface of the outer housing in a direction toward the first surface of the outer housing; and
a second part extending from an end of the first part in the direction toward the first surface of the outer housing,
wherein the second part has a diameter gradually decreasing from a second diameter, and
wherein the second diameter is smaller than a first diameter of the first part.

20. The case of claim 15, wherein the first conductive member comprises an area corresponding to a portion of the peak has been partially removed.

* * * * *